United States Patent [19]

Howard et al.

[11] Patent Number: 5,529,120
[45] Date of Patent: Jun. 25, 1996

[54] HEAT EXCHANGER FOR ELECTRICAL CABINET OR THE LIKE

[75] Inventors: Paul A. Howard, Vienna; James H. Durham, Reston, both of Va.

[73] Assignee: Hubbell Incorporated, Orange, Conn.

[21] Appl. No.: 189,756

[22] Filed: Feb. 1, 1994

[51] Int. Cl.[6] .................................................. F28F 3/00
[52] U.S. Cl. .................. 165/166; 165/164; 165/151; 165/104.33; 174/16.3; 361/697; 361/692
[58] Field of Search ................. 165/104.33, 136, 165/104.34, 80.3, 903, 128, 148, 164, 170, 185, 172, 164, 183, 166, 165; 361/690, 692, 695, 697; 174/16.3, 16.1

[56] References Cited

U.S. PATENT DOCUMENTS

| | | | |
|---|---|---|---|
| 1,425,933 | 8/1922 | Andersen | 165/148 |
| 1,449,782 | 3/1923 | Rutherford | 165/148 |
| 1,926,792 | 7/1933 | Reichart | 165/148 |
| 2,339,284 | 1/1944 | Modine | 257/128 |
| 2,428,145 | 9/1947 | Cook | 165/182 |
| 2,434,676 | 1/1948 | Spender | 165/148 |
| 2,554,185 | 5/1951 | Giegerich | 165/148 |
| 2,610,039 | 9/1952 | Dickman | 165/164 |
| 2,874,941 | 2/1959 | Woolard et al. | 165/170 |
| 3,236,296 | 2/1966 | Dubin | 165/80 |
| 3,703,925 | 11/1972 | Ireland et al. | 165/165 X |
| 3,810,509 | 5/1974 | Kun | 165/148 |
| 4,042,903 | 8/1977 | Finegan, Jr. | 174/16.3 |
| 4,270,602 | 6/1981 | Foster | 165/167 |
| 4,386,651 | 6/1983 | Reinhard | 165/104 |
| 4,447,856 | 5/1984 | Takahashi et al. | 361/383 |
| 4,449,579 | 5/1984 | Miyazaki et al. | 165/104 |
| 4,473,066 | 9/1984 | Clark | 165/170 |
| 4,535,386 | 8/1985 | Frey, Jr. et al. | 361/389 |
| 4,592,414 | 6/1986 | Beasley | 165/76 |
| 4,646,817 | 3/1987 | Van Ee | 165/164 X |
| 4,774,631 | 9/1988 | Okuyama et al. | 361/384 |
| 4,789,027 | 12/1988 | Diethelm | 165/182 X |
| 4,837,663 | 6/1989 | Zushi et al. | 361/384 |
| 4,840,225 | 6/1989 | Foley et al. | 165/104 |
| 4,949,218 | 8/1990 | Blanchard et al. | 361/384 |
| 4,953,058 | 8/1990 | Harris | 361/383 |
| 5,031,693 | 7/1991 | VanDyke | 165/166 |
| 5,040,095 | 8/1991 | Beaty et al. | 361/384 |
| 5,054,545 | 10/1991 | Ghaemian | 165/104 |
| 5,069,276 | 12/1991 | Seidel | 165/166 |
| 5,138,522 | 8/1992 | Kojima et al. | 361/384 |
| 5,201,866 | 4/1993 | Mok | 165/80.3 |
| 5,218,513 | 6/1993 | Brown | 361/384 |
| 5,373,895 | 12/1994 | Yamamoto et al. | 165/148 |

FOREIGN PATENT DOCUMENTS

| | | | |
|---|---|---|---|
| 0008268 | 2/1980 | European Pat. Off. | |
| 0021161 | 1/1981 | European Pat. Off. | |
| 332913 | 11/1903 | France | |
| 601276 | 2/1926 | France | |
| 1928146 | 12/1969 | Germany | |
| 2505640 | 9/1975 | Germany | |
| 4031355 | 4/1992 | Germany | |
| 4207761 | 9/1992 | Germany | |
| 0188855 | 11/1982 | Japan | 165/185 |
| 62-013997 | 1/1987 | Japan | |
| 62-026489 | 2/1987 | Japan | |
| 573998 | 12/1945 | United Kingdom | |
| 985285 | 3/1965 | United Kingdom | |
| 1199067 | 7/1970 | United Kingdom | |
| 1558575 | 1/1980 | United Kingdom | |
| 2034872 | 6/1980 | United Kingdom | |
| 9013394 | 11/1990 | WIPO | |

*Primary Examiner*—John Rivell
*Assistant Examiner*—Christopher A. Atkinson
*Attorney, Agent, or Firm*—Jerry M. Presson; John E. Holmes

[57] ABSTRACT

A simple and inexpensive air-to-air heat exchanger for cooling an electrical equipment cabinet or the like comprises a plurality of connected sections which are substantially identical to each other. In one embodiment, each section comprises a channel for carrying a flow of air and at least one heat exchange fin extending outwardly from the channel for exchanging heat between the air in the channel and the air outside the channel. In a second embodiment, each section of the heat exchanger comprises two adjacent channels which are open along one side, and the channels are closed off to form air flow conduits when the heat exchanger sections are attached to each other.

21 Claims, 11 Drawing Sheets

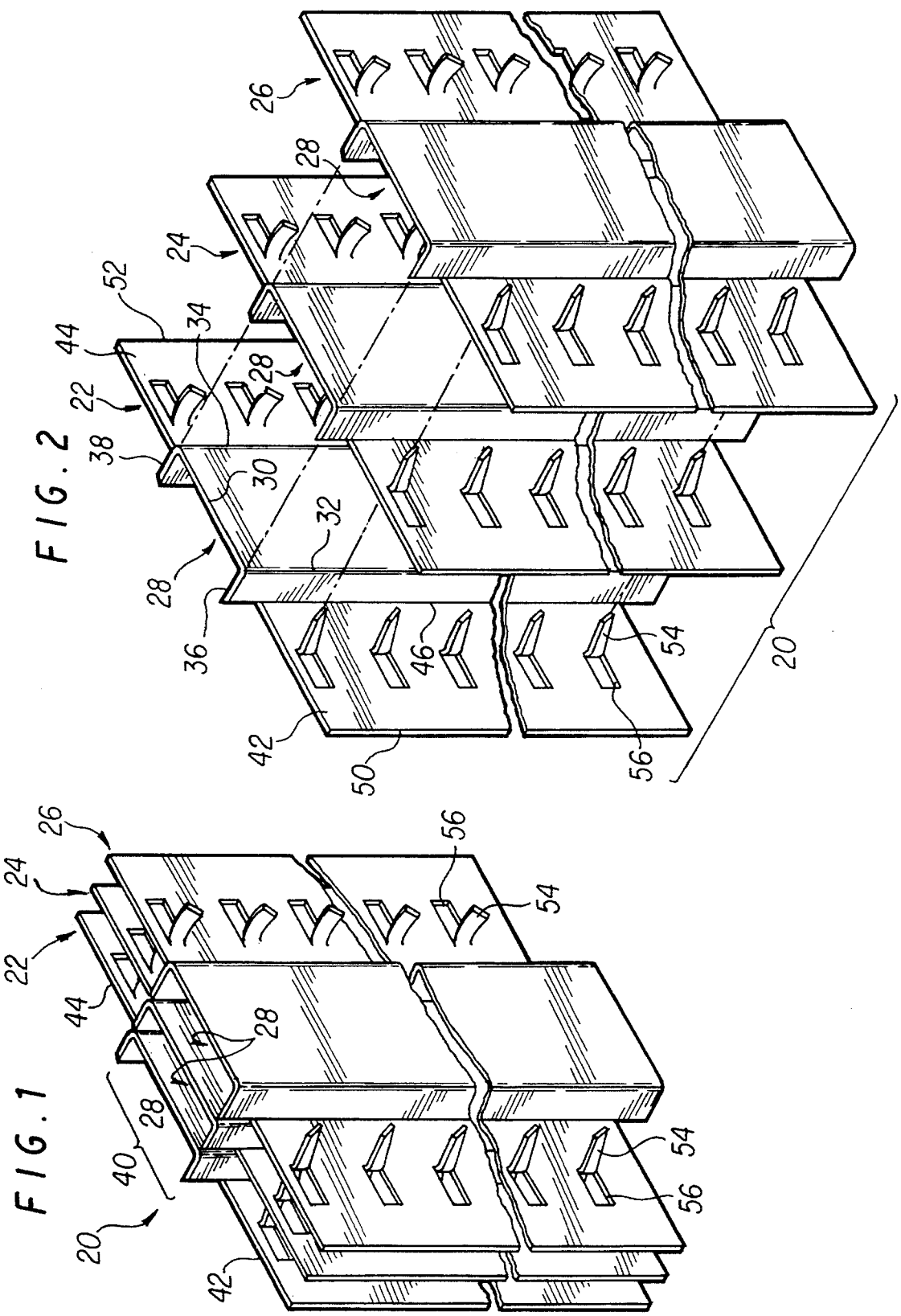

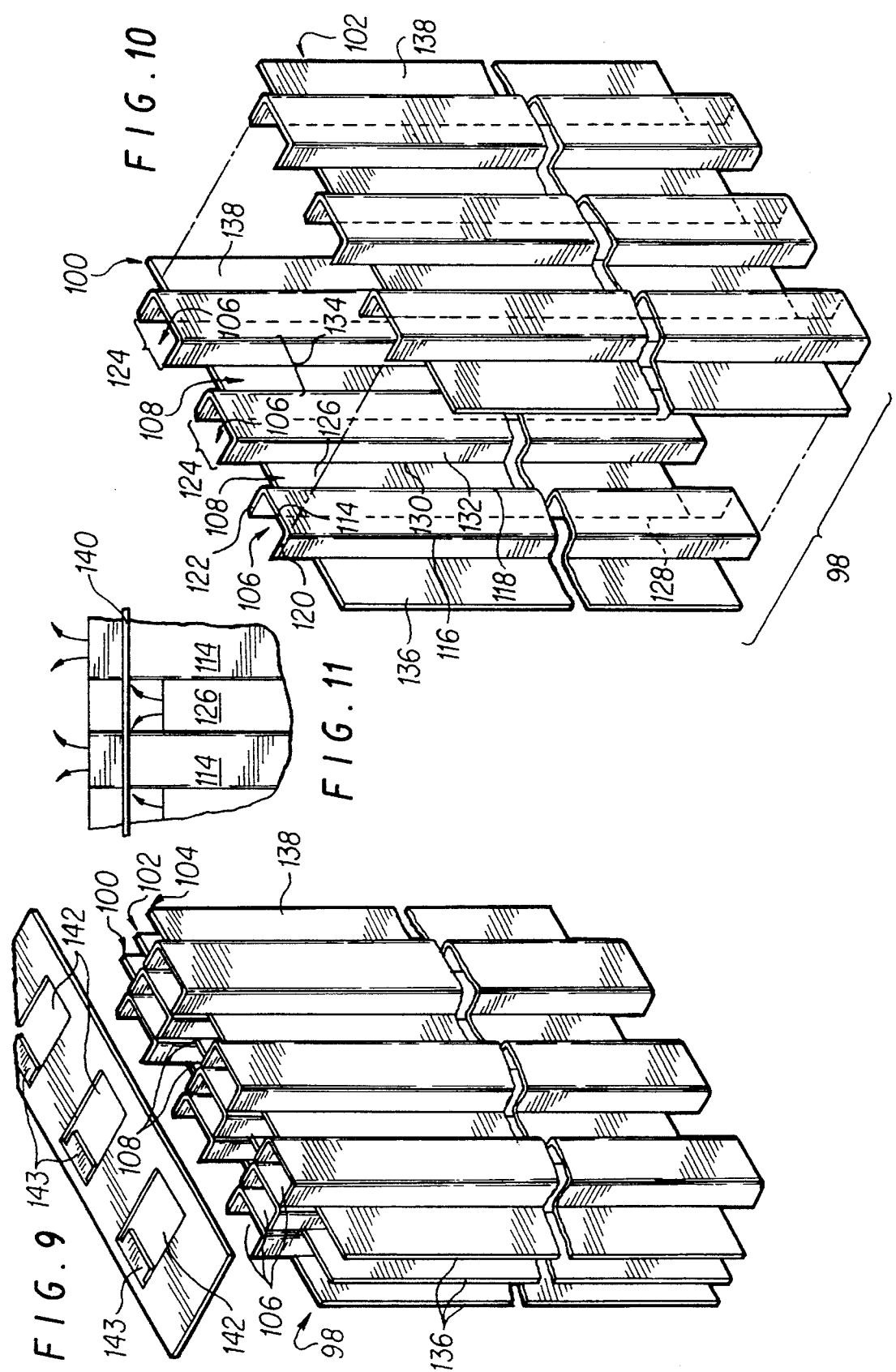

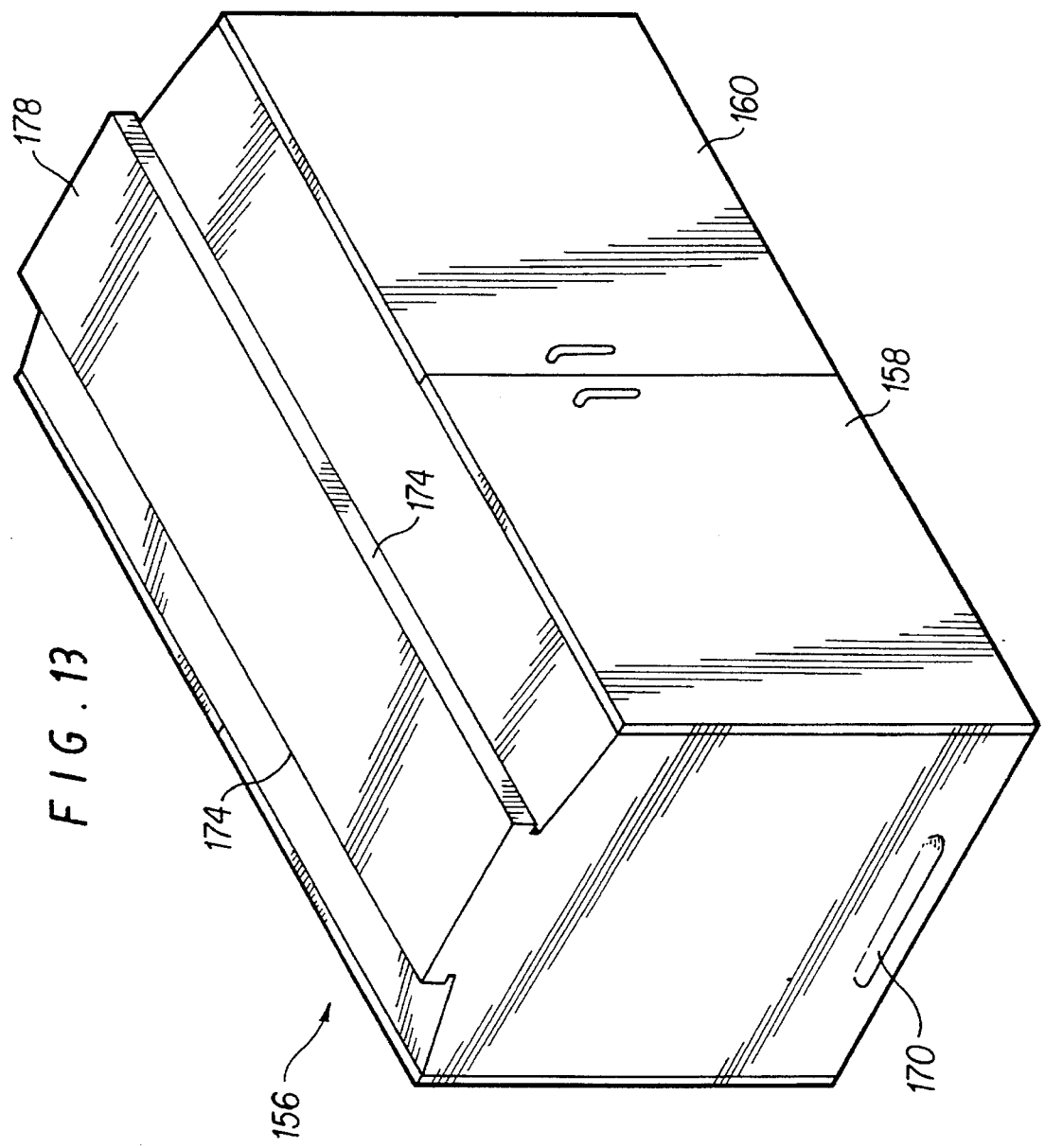

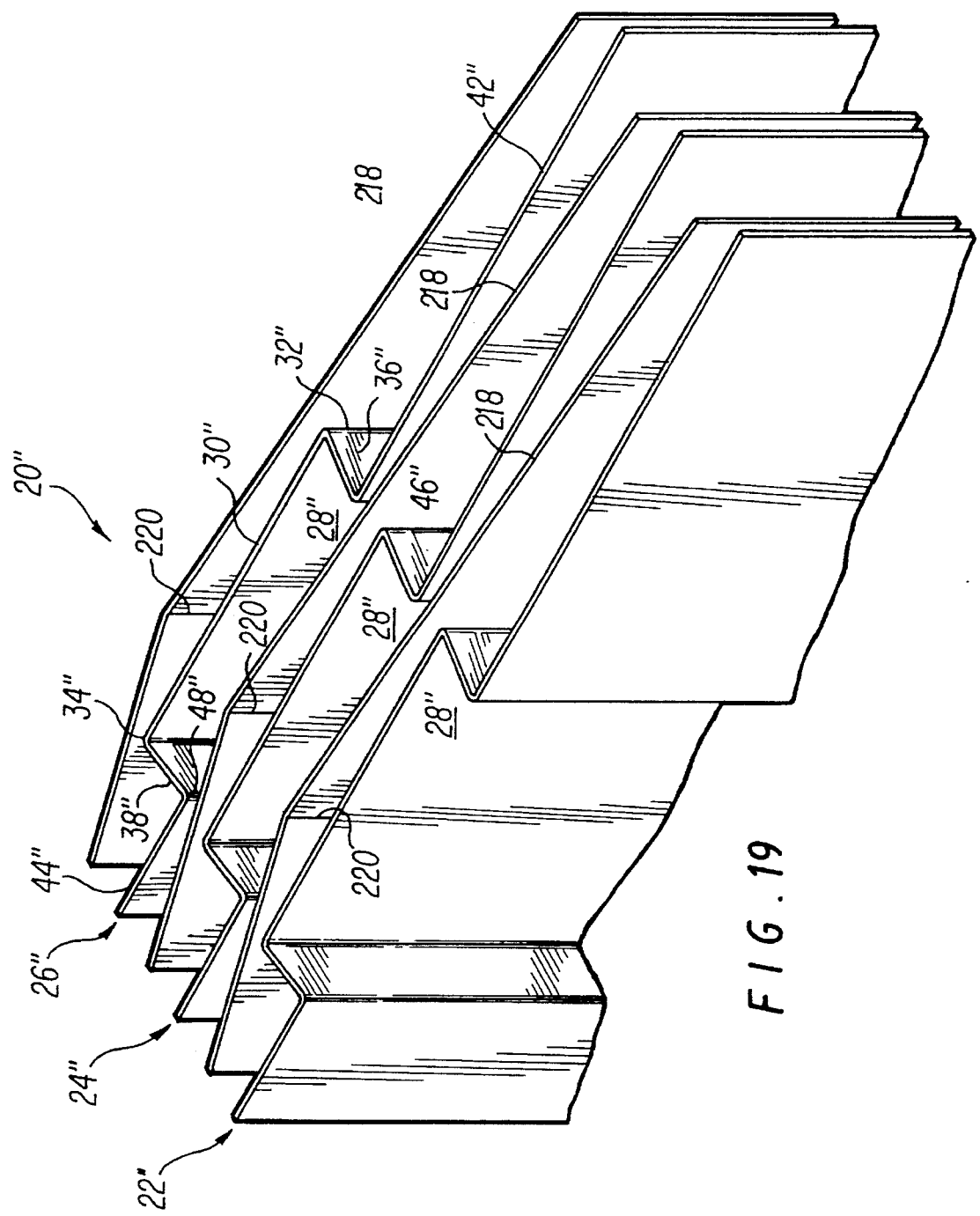

HEAT EXCHANGER FOR ELECTRICAL CABINET OR THE LIKE

FIELD OF THE INVENTION

The present invention relates to an air-to-air heat exchanger for cooling an electrical equipment cabinet or the like. More specifically, the invention relates to an air-to-air heat exchanger which can be assembled from a plurality of connected sections which are substantially identical to each other, and which allows a closed or sealed environment to be maintained in the electrical cabinet.

BACKGROUND OF THE INVENTION

Electrical cabinets are often used for housing various types of electrical and electronic equipment at outdoor and indoor locations. These cabinets have several functions, which typically include the avoidance of electrical safety hazards by preventing unauthorized contact with the equipment, and the protection of the equipment itself from tampering or accidental damage. In the case of electrical cabinets installed at outdoor locations, an additional function of the cabinet may be to protect the equipment from damage caused by precipitation, moisture, solar heating, and other environmental conditions.

In one common application, outdoor electrical cabinets are employed by local telephone companies to house the channel banks which carry out analog-to-digital and digital-to-analog conversion between telephone company lines and individual subscriber lines. In situations where fiber optic telephone lines are used, the cabinets may also house interface circuits for coupling the fiber optic lines with conventional metallic conductors leading to the subscribers' telephone equipment. In all of these applications, there is a desire to make the cabinets as small and as low in height as possible for aesthetic reasons, since they are often installed in residential neighborhoods. The increasing miniaturization of electronic components has made smaller cabinets possible.

Most types of electronic equipment generate significant amounts of heat which must be dissipated in order to prevent the equipment from overheating and possibly malfunctioning. When the equipment is housed in a cabinet, the most straightforward approach for providing cooling is to maintain a flow of air between the interior and exterior of the cabinet through vents or louvers. This may be accomplished through natural convection, but fans may be required when the equipment is tightly packed within the cabinet and does not allow sufficient air flow for convective cooling. Unfortunately, the introduction of outside air is undesirable in many instances, particularly when the air contains contaminants that are detrimental to the operation of the electrical equipment, such as salt spray or agricultural chemicals. Although various types of filters can be employed to reduce the infiltration of contaminants, these filters are not completely effective and require periodic cleaning or replacement.

In order to maintain the cleanest possible environment within an electrical cabinet, the cabinet can be designed in such a manner that it is closed or sealed with respect to the outside air. This effectively eliminates problems caused by airborne contaminants and other environmental conditions, but it complicates the problem of cooling since it is no longer possible to maintain an air flow between the interior and exterior of the cabinet in order to dissipate heat. If the cabinet is sufficiently large and the equipment inside the cabinet is not too densely packed, sufficient cooling may be provided by natural convection currents within the cabinet and by heat transfer through the walls of the cabinet. However, given the current trend toward smaller cabinets and more tightly packed equipment, these conditions are usually not present.

Several attempts have been made to devise air-to-air heat exchangers for use in electrical cabinets, with the goal of maintaining a closed or sealed environment within the cabinet while providing adequate cooling for the electrical components enclosed in the cabinet. In U.S. Pat. No. 5,040,095, to Beaty et al, cooling of a sealed telephone equipment cabinet is provided by means of a jacket which encompasses the top and two sides of a sealed compartment within the cabinet and forms a cooling air passage around the compartment. The roof of the compartment is corrugated for increased heat dissipation, and cooling air is forced between the corrugated roof and the outer jacket to cool the interior compartment. Although this arrangement has the advantage of allowing the interior compartment to remain closed with respect to the outside air, the irregularity of the corrugated roof surface makes it difficult to form an effective seal between the roof and the walls of the compartment. Moreover, because the corrugated surface inherently presents the same surface area on the top and bottom, the amount of heat transfer is equivalent to that obtained with a flat sheet (albeit one of somewhat larger dimensions) and cannot be optimized based on the amount of air flow that would be expected to occur on each side. Finally, since the cooling air enters and exits the outer jacket through vents or louvers located near the base of the cabinet, a purely convective air flow is not practical and a fan is required to maintain a sufficient flow of air.

Another approach to the problem of maintaining a closed or sealed environment within an electrical cabinet is exemplified by U.S. Pat. No. 4,949,218, to Blanchard et al. In this patent, a pair of cooling fin assemblies are mounted in the upper interior portion of the cabinet in order to serve as a heat exchanger. Each cooling fin assembly consists of a plurality of horizontally elongated fins which are spaced apart by means of spacer bars, with each fin extending both above and below the spacer bars. The spacer bars extend the full horizontal length of the fins, and create a solid wall which divides the upper portion of each fin from the lower portion. The cooling fin assemblies are installed in an air duct which extends horizontally across the top of the cabinet, with the spacer bars forming the lower wall of the air duct and the lower portions of the fins extending into the sealed cabinet area below. Fans are mounted at opposite ends of the air duct to cause outside air to flow horizontally through the upper portions of the fins, and the lower portions of the fins absorb heat from the interior of the cabinet. Although this arrangement provides isolation between the interior and exterior of the cabinet, the cooling fin assemblies are relatively complex and difficult to fabricate, adding significantly to the cost of the cabinet. Also, the horizontal orientation of the air duct makes it impractical to rely on a purely convective flow of outside air, and hence fans are required for efficient cooling. A further disadvantage is that the air duct, cooling fin assemblies and fans add significantly to the height of the cabinet, making it difficult to achieve a low cabinet height that is often desired for aesthetic reasons.

In summary, the prior art has failed to provide a simple, inexpensive and effective heat exchanger construction which allows a closed environment to be maintained within an electrical cabinet. The arrangements proposed so far, as exemplified by those discussed above, are relatively complex in construction and are generally not readily adaptable to conventional types of cabinet designs without substantial modification. Also, the existing arrangements are not practical for use with purely convective air flows, and hence additional complexity is introduced because of the need for powered fans to maintain the required air flow.

SUMMARY OF THE INVENTION

A primary object of the present invention is to provide an air-to-air heat exchanger which is simple and inexpensive to fabricate, and which can be adapted for use with existing types of electrical cabinet designs.

A further object of the invention is to provide an air-to-air heat exchanger which is sectional or modular in construction, so that heat exchangers of different sizes and cooling capacities can be assembled simply by using different numbers of sections or modules.

A further object of the invention is to provide a sectional or modular heat exchanger in which the individual sections or modules are extremely simple in construction, and can be fabricated from a single sheet of metal or other material.

Still another object of the present invention is to provide a heat exchanger which can operate effectively using passive or convective air flows, but which can be adapted for use with powered fans when additional heat transfer capacity is required.

Still another object of the present invention is to provide an air-to-air heat exchanger which is not constrained to present the same surface area to the interior and exterior air flows, so that the operation of the heat exchanger can be optimized based on the relative magnitudes of these air flows.

The foregoing objects are substantially achieved by providing a heat exchanger section which is adapted to be connected to one or more like sections to form an air-to-air heat exchanger for cooling an electrical equipment cabinet or the like. Each section comprises a channel defined by a first longitudinal side wall having first and second laterally opposed edges, and by second and third longitudinal side walls Joined to said first and second laterally opposed edges, respectively, with the second and third side walls being unconnected to each other to leave a longitudinal opening extending along the length of the channel. The heat exchanger section further comprises a first heat exchange fin carried by at least one of the second and third side walls, respectively, and extending outwardly with respect to the channel. The heat exchanger section can be connected to a like heat exchanger section in a manner such that the first side wall of the connected heat exchanger section closes the longitudinal opening in the channel in order to define a conduit for a flow of air, with the first and second heat exchange fin serving to exchange heat between the air in the conduit and the air outside the conduit.

In accordance with a further aspect of the present invention, an air-to-air heat exchanger for cooling an electrical equipment cabinet or the like comprises a plurality of connected sections which are substantially identical to each other, with each section comprising a channel for carrying a flow of air and a heat exchange fin extending outwardly from the channel for exchanging heat between the air in the channel and the air outside the channel. The heat exchanger sections are connected to each other in a manner such that the channels of adjacent sections extend parallel to each other and the heat exchange fins of adjacent sections are spaced apart from each other.

In accordance with another aspect of the present invention, a heat exchanger section is provided which is adapted to be connected to one or more like sections to form an air-to-air heat exchanger for cooling an electrical equipment cabinet or the like, with each section comprising a first channel having inlet and outlet ends and a second channel adjacent to the first channel and also having inlet and outlet ends. The first channel is defined by a first longitudinal side wall having first and second laterally opposed edges, and by second and third longitudinal side walls joined to said first and second laterally opposed edges, respectively, with the second and third side walls being unconnected to each other to leave a longitudinal opening extending along the length of the first channel between the inlet and outlet ends of the first channel. The second channel is defined by a fourth longitudinal side wall having first and second laterally opposed edges, with one of said first and second laterally opposed edges of the fourth side wall being Joined to one of the second and third side walls of the first channel so that said second or third side wall of the first channel forms a common side wall with the second channel. The second channel is further defined by a fifth side wall joined to the other of said first and second laterally opposed edges of the fourth side wall, with the fifth side wall being unconnected to said second or third side wall of said first channel to leave a longitudinal opening extending along the length of said second channel between the inlet and outlet ends of the second channel. The heat exchanger section is connectable to a like heat exchanger section in a manner such that the longitudinal opening in the first channel is closed off by the first side wall of a connected heat exchanger section in order to define a first conduit for a flow of air, and such that the fourth side wall closes off the longitudinal opening in the second channel of a connected heat exchanger section in order to define a second conduit for a flow of air. The first, second and third side walls of the first channel extend beyond the fourth side wall of the second channel at the inlet and outlet ends of the first and second channels, allowing a partition to be installed to separate the air flows in the first and second channels.

In accordance with a further aspect of the present invention, an air-to-air heat exchanger for cooling an electrical equipment cabinet or the like comprises a plurality of connected sections which are substantially identical to each other, with each section comprising a first channel and a second channel adjacent to the first channel. The first channel has an inlet end, an outlet end, longitudinal side walls extending between the inlet and outlet ends, and a longitudinal opening extending along the length of the first channel between the inlet and outlet ends of the first channel. The second channel similarly comprises an inlet end, an outlet end, longitudinal side walls extending between the inlet and outlet ends, and a longitudinal opening extending along the length of the second channel between the inlet and outlet ends of the second channel. The heat exchanger sections are connected to each other in a manner such that the longitudinal openings in the first and second channels of each heat exchanger section are closed off by opposing longitudinal walls of at least one connected heat exchanger section in order to define first and second air flow conduits.

In accordance with a still further aspect of the present invention, an air-to-air heat exchanger for cooling an electrical equipment cabinet or the like comprises a plurality of connected sections which are substantially identical to each other, with each section having opposing first and second faces. The first face of each heat exchanger section has a pair of edges which are spaced apart from each other, and the second face of the heat exchanger section has a pair of grooves for receiving the edges on the first face of a connected heat exchanger section.

In accordance with yet another aspect of the present invention, an electrical equipment cabinet is provided which comprises an enclosure adapted to contain heat-generating electrical equipment, and an air-to-air heat exchanger mounted in the cabinet for removing heat from the cabinet while maintaining a substantially closed environment in the cabinet. The heat exchanger comprises an air channel extending substantially vertically through the interior of the cabinet and having an air inlet and air outlet, both communicating with the exterior of the cabinet. The heat exchanger further comprises at least one heat exchange fin carried by the air channel and extending into the interior of the cabinet for promoting the exchange of heat between the air in the cabinet and the air in the channel.

Other objects, advantages and novel features of the present invention will become apparent from the following detailed description which, when taken in conjunction with the annexed drawings, discloses preferred embodiments of the invention.

BRIEF DESCRIPTION OF THE DRAWINGS

Referring now to the drawings, which form a part of the original disclosure:

FIG. 1 is a perspective view of a first embodiment of an air-to-air heat exchanger constructed in accordance with the present invention;

FIG. 2 is an exploded view of the heat exchanger of FIG. 1, illustrating the individual sections or modules which make up the heat exchanger;

FIG. 9 is a perspective view of a second embodiment of an air-to-air heat exchanger constructed in accordance with the present invention;

FIG. 10 is an exploded view of the heat exchanger of FIG. 9, illustrating the individual sections or modules which make up the heat exchanger;

FIG. 11 is a detailed view of the top portion of the heat exchanger shown in FIG. 9, illustrating the manner in which a partition may be installed to divide the air flows in adjacent channels;

FIG. 13 is a perspective view of an electrical cabinet in which heat exchangers of the type illustrated in FIG. 9 have been installed;

FIG. 19 is a perspective view of a fourth embodiment of an air-to-air heat exchanger constructed in accordance with the present invention, in which sealing plates have been interposed between adjacent heat exchanger sections.

DETAILED DESCRIPTION OF THE PREFERRED EMBODIMENTS

Figure 5:
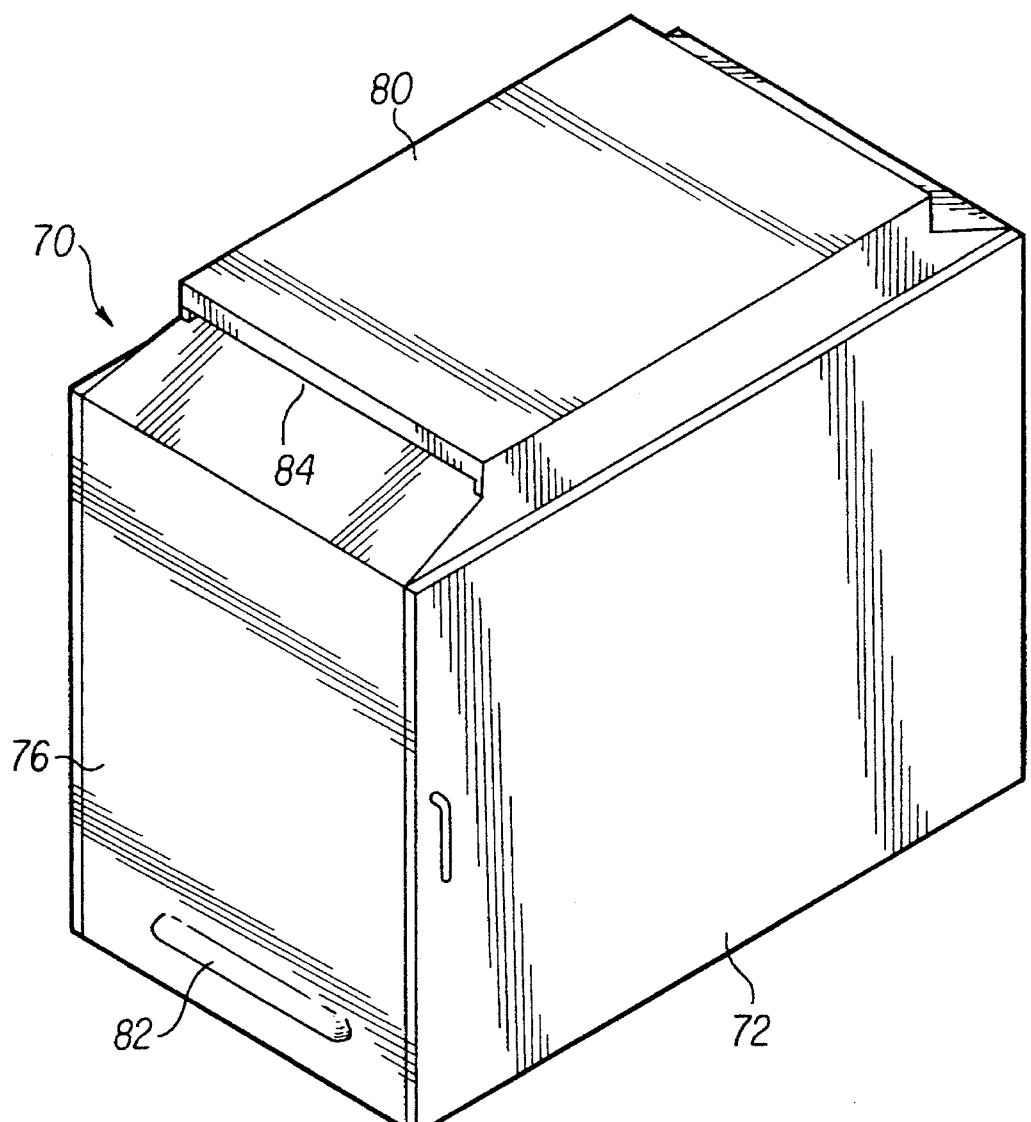
FIG. 5 is a perspective view of an electrical cabinet in which heat exchangers of the type illustrated in FIG. 1 have been installed.
Figure 3:
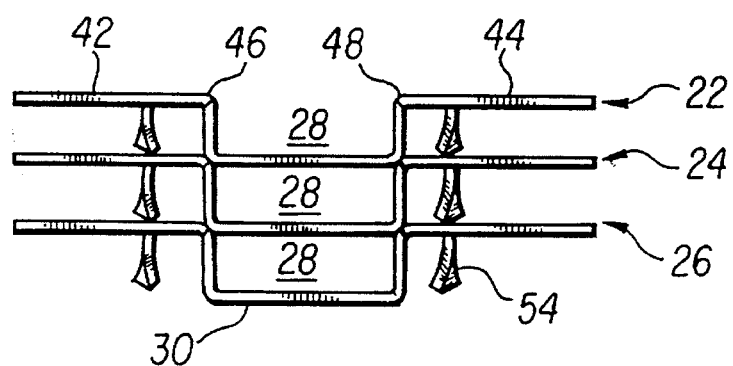
FIG. 3 is a top view of the heat exchanger of FIG. 1, illustrating the spacers between adjacent fins.

An air-to-air heat exchanger 20 constructed in accordance with the present invention is illustrated in FIGS. 1–3. As best seen in the exploded view of FIG. 2, the heat exchanger 20 comprises three connected sections or modules 22, 24 and 26 which are substantially identical to each other. It should be understood that the number of sections shown is purely illustrative, and that a greater or lesser number of section may be employed to suit the requirements of particular applications. Taking the innermost section 22 as an example, each section will be seen to comprise a channel 28 which is defined in part by a longitudinal side wall 30 having first and second parallel, laterally opposed edges or corners 32 and 34. Two additional longitudinal side walls 36 and 38 are joined to the laterally opposed edges 32 and 34, respectively, and extend in planes which are perpendicular to that of the side wall 30. Thus, the channel 28 has a substantially rectangular cross-section as shown. The side walls 36 and 38 are unconnected to each other at their rearmost edges, as shown, in order to leave a rear-facing longitudinal opening 40 which extends vertically along the length of the channel 28. The heat exchanger sections 22, 24 and 26 will ordinarily be somewhat longer in the vertical dimension than they are shown to be in FIGS. 1 and 2, and hence break lines have been used in these figures to indicate that only the top and bottom portion of each section is shown. In the preferred embodiment, each heat exchanger section 22, 24 and 26 has the same configuration along its entire length, and in preferably made in a single piece.

With continued reference to FIGS. 1–3, the heat exchanger section 22 further includes a pair of heat exchange fins 42 and 44 which are carried by the longitudinal side walls 36 and 38, respectively. In the assembled condition of the heat exchanger 20, as shown in FIG. 1, the channel 28 forms a conduit for a flow of cooling air and the fins 42 and 44 serve to exchange heat between the air in the conduit and the air outside the conduit. In the preferred embodiment, the heat exchange fins 42 and 44 are in the form of rectangular panels and extend in planes which are parallel to that of the longitudinal side wall 30. The fins 42 and 44 have their innermost edges Joined to the rearmost edges or corners 46 and 48, respectively, of the longitudinal side walls 36 and 38. With this arrangement, and with the forward edges of the longitudinal side walls 36 and 38 joined to the laterally opposed edges 32 and 34, respectively, of the longitudinal side wall 30, the entire heat exchanger section 22 can be formed from a single sheet of metal or other material. It is also preferred that the fins 42 and 44 terminate in free outer edges 50 and 52, as shown, although this is not essential and the fins may be connected to other structures if desired.

As illustrated in FIGS. 1 and 2, the fins 42 and 44 are formed with spacers 54 for maintaining a predetermined minimum spacing between the fins of adjacent connected heat exchanger sections. Although the spacers may take a variety of forms, a simple and effective spacer may be created by forming small rectangular cut-outs at evenly spaced intervals along the length of each fin. The rectangular areas are cut or punched only along three sides, with the fourth side (preferably corresponding to one of the smaller sides of the rectangle) being left uncut to provide a fold line. The material within the cut-out portion of the rectangle is then bent along the fold line so that it extends approximately perpendicularly to the plane of the fin by a distance sufficient to make contact with the rear fin surface of the next heat exchanger section. This relationship is illustrated most clearly in FIG. 3. In addition to bending the spacers 54 in the manner described, the spacers are preferably twisted about their median lines as shown. This insures that the outermost end of each spacer 54 will not align with the corresponding cut-out portion 56 of the next adjacent fin, but instead will contact a solid region of the fin surface. Another desirable feature of the twisted spacers 54 is that they introduce a degree of turbulence in the air flowing past the fins 42 and 44. The cut-out areas 56 are also advantageous in that they allow air to circulate between the fins of the adjacent connected heat exchanger sections 22, 24 and 26.

The individual heat exchanger sections 22, 24 and 26 are preferably made from a metallic material of high thermal conductivity, such as aluminum, in order to insure maximum heat transfer between the air flowing in the channels 28 and the heat exchange fins 42 and 44. The cost of the heat exchanger can be minimized by employing a relative thin gauge of aluminum, since the folding between the longitudinal walls 30, 36 and 38 and fins 42, 44 provide the structure with a considerable degree of rigidity. The spacers 54 are also of assistance in this regard, since the fins 42 and 44 are supported only at one edge in the illustrated embodiment, and would be subject to warping and bending in the absence of the spacers 54. In the event that the fins 42 and 44 are made wider in the horizontal dimension, additional rows of spacers 54 may be provided to afford additional support and rigidity.

The individual heat exchanger sections 22, 24 and 26 may be affixed to each other by any desired method to form the assembled heat exchanger 20. For example, the laterally opposed edges 32 and 34 of the longitudinal side wall 30 of the heat exchanger section 22 may be welded or brazed to the rearmost edges of the longitudinal side walls 36 and 38 of the next adjacent heat exchanger section 24, and similarly for the remaining heat exchanger sections. Alternatively, interlocking tabs or other types of fasteners may be used to attach the adjacent heat exchanger sections to each other, or the heat exchanger sections may be pressed or ganged together. In the assembled condition of the heat exchanger 20, the longitudinal opening 40 in each heat exchanger section is closed off by the longitudinal side wall 30 of the next adjacent heat exchanger section, as best seen in FIGS. 1 and 3. In this way, the channels 28 and walls 30 define closed conduits for a flow of cooling air. Typically, the heat exchanger 20 will be installed in the interior of an electrical cabinet, and a flow of cooling air from outside the cabinet will be maintained in the channels 28 by convection or through the use of powered fans. Ducts and plenum chambers may be used to conduct the cooling air through the channels 28 without introducing any outside air into the cabinet, and the heat exchange fins 42 and 44 will cool the interior of the cabinet by absorbing heat from air within the cabinet and transferring it by thermal conduction to the air flowing in the channels 28. It will usually be desirable to connect the various channels 28 in common by providing plenum chambers (not shown) at the top and bottom of the heat exchanger 20. This is facilitated by extending the longitudinal side walls 30, 36 and 38 of each heat exchanger section somewhat above and below the top and bottom edges of the fins 42 and 44, as shown, in order to create a projecting duct or fitting which can be inserted through a corresponding opening in a plenum chamber.

When a number of heat exchanger sections 22, 24 and 26 are assembled to create an air-to-air heat exchanger 20, as shown in FIG. 1, the longitudinal opening 40 in the channel 28 of the innermost or rearmost section 22 will remain open since it is not closed off by the longitudinal wall 30 of an adjacent heat exchanger section. In a typical installation, however, the heat exchanger 20 can be affixed to an interior surface of an electrical cabinet by placing the rearmost edges of the longitudinal side walls 36 and 38 into contact with the interior cabinet surface. In this way, the cabinet surface itself serves as the means for closing off the longitudinal opening 40 in the innermost heat exchanger section 22. Alternatively, in situations where the heat exchanger 20 is mounted in a freestanding manner, a separate partition may be used to close off the longitudinal opening 40 of the innermost heat exchanger section 22. From the foregoing description, it will also be appreciated that an operative air-to-air heat exchanger may be formed by using only one heat exchanger section 22, simply by closing off the longitudinal opening 40 in an appropriate manner.

Figure 4:
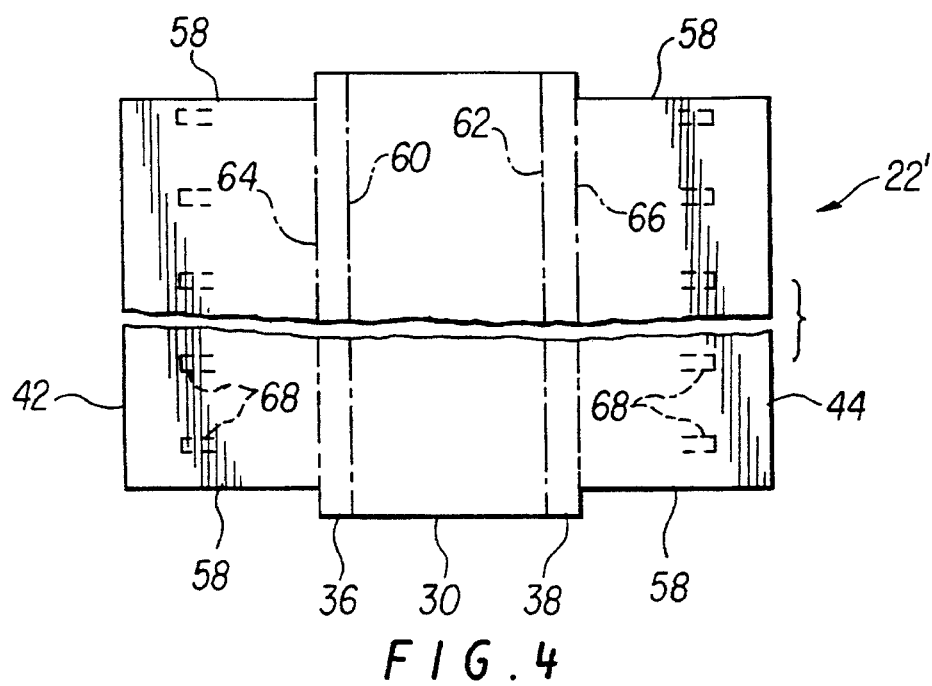
FIG. 4 is a plan view of a sheet material blank which may be used to form one of the heat exchanger sections shown in FIG. 2.

As noted previously, each of the heat exchanger sections 22, 24 and 26 of FIGS. 1–3 is preferably formed from a single sheet of aluminum or other suitable thermally conductive material. FIG. 4 illustrates a sheet material blank which may be used for this purpose. The blank 22' comprises a flat sheet of material, such as 0.010 to 0.025-inch thick aluminum, which is cut in a rectangular shape with right-angle notches 58 at the corners to define the top and bottom edges of the fins 42 and 44. Vertical fold lines 60 and 62 are formed to define the edges of the longitudinal side wall 30, and parallel fold lines 64 and 66 are formed to define the longitudinal side walls 36 and 38 and the heat exchange fins 42 and 44. Small three-sided rectangular cut-outs 68 are formed in the fins 42 and 44, as shown, to create the spacers 54 and apertures 56. It will be apparent that, simply by changing the locations of the various fold and cut lines on the blank 22', the relative dimensions of the channel 28 and fins 42 and 44 of the heat exchanger section 22 can be changed. This allows the configuration of the heat exchanger to be adapted to specific applications. For example, in situations where a relatively slow rate of air movement through the channel 28 is expected, the cross-section of the channel 28 may be made large relative to the horizontal length or span of the fins 42 and 44. This may be desirable in cases where the air movement through the channel 28 is passive or convective, without any assistance from fans or the like. Conversely, in situations where a relatively fast rate of air movement through the channel 28 is expected due to the use of a fan, the cross-section of the channel 28 can be made somewhat smaller. Similarly, the dimensions of the fins 42 and 44 can be varied in accordance with the expected conditions inside the electrical cabinet. If circulation fans are used inside the cabinet to force air past the fins 42 and 44, a relatively small fin size may be sufficient; if not, the fins may be made larger to increase their ability to absorb heat from the interior of the cabinet.

FIGS. 5–8 illustrate an outdoor electrical cabinet in which a heat exchanger of the type illustrated in FIG. 1 may be installed. The cabinet 70 has a generally upright rectangular shape, with front and rear doors 72 and 74 hinged on opposite sides of the cabinet, side walls 76 and 78, and a pagoda-type roof 80. Cooling air for the electronic components within the cabinet 70 is drawn in through vents or louvers 82 located near the base of the cabinet, and is exhausted through slots 84 in the pagoda roof 80. The configuration of the slots 84 precludes the entry of water due to precipitation, splashing and the like.

Figure 6:
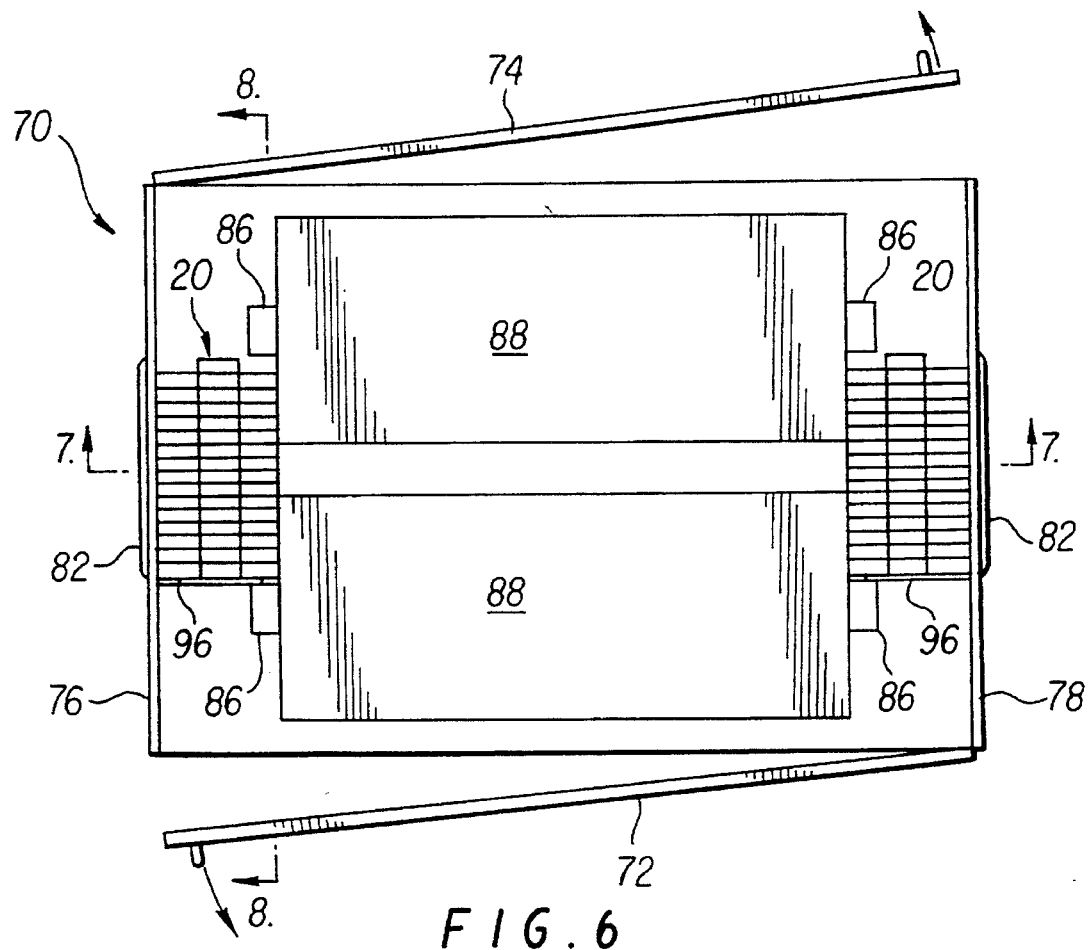
FIG. 6 is a top sectional view of the electrical cabinet shown in FIG. 5.
Figure 7:
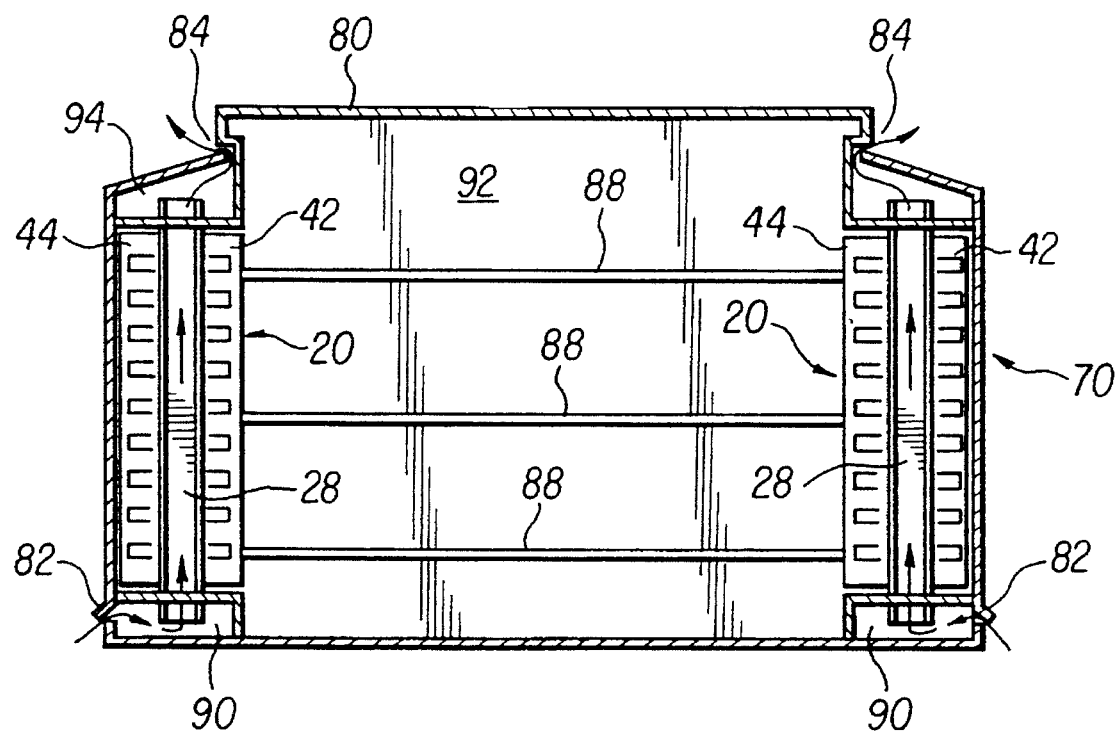
FIG. 7 is a front sectional view of the electrical cabinet shown in FIG. 5.
Figure 8:
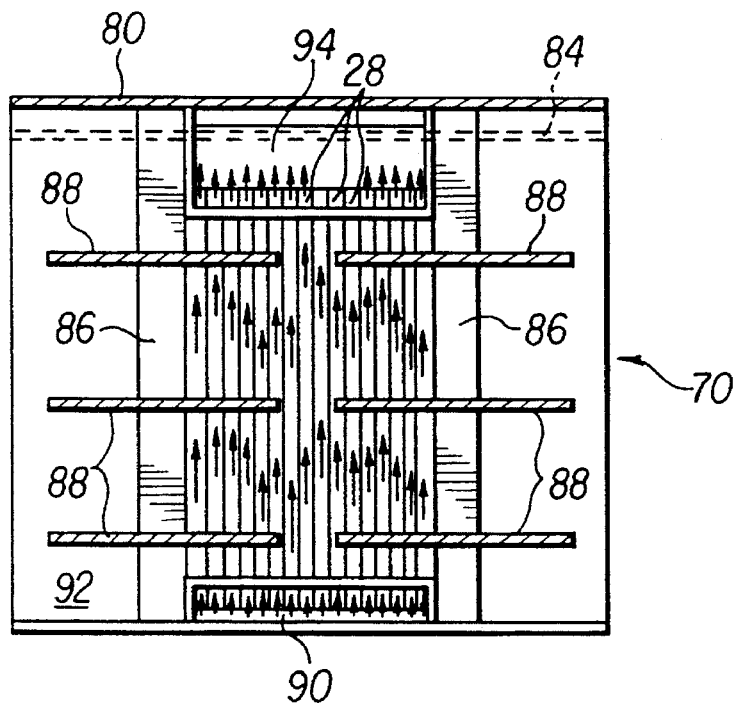
FIG. 8 is a side sectional view of the electrical cabinet shown in FIG. 5.

As best seen in FIGS. 6, 7 and 8, the interior of the cabinet 70 includes a number of upright channel members 86 which support a plurality of vertically stacked shelves 88. The shelves accommodate various types of slide-in racks or drawers (not shown) containing electrical or electronic equipment. As best seen in FIG. 6, the cabinet design includes unused space between the shelves 88 and the side walls 76 and 78, and between each front and rear pair of channel members 86. This space may be used for the installation of a heat exchanger 20 as illustrated in FIGS. 6–8. The heat exchanger 20 is of the type illustrated in FIG. 1, except that a greater number of heat exchanger sections are used in order to completely fill the space between the channel members 86.

The air flow through the heat exchangers 20 in the cabinet 70 will be evident from FIGS. 7 and 8. Outside air is drawn in through the vents or louvers 82 near the bottom of the cabinet 70, and enters a plenum chamber 90 below each of the heat exchangers 20. The plenum chambers 90 serve to combine the channels 28 of the various heat exchanger sections, and are formed with upper apertures for tightly receiving the downwardly projecting portions of the longitudinal walls 30, 36 and 38 of each heat exchanger section. In this way, the air flow entering the vents or louvers 82 is routed directly to the channels 28 of the heat exchanger sections without entering the interior 92 of the electrical cabinet. In a similar manner, the air exiting from the top of the channels 28 is received in upper plenum chambers 94 which are formed with bottom apertures for tightly receiving the projecting upper portions of the longitudinal walls 30, 36 and 38 of the heat exchanger sections. The air in the upper plenum chambers 94 then exits through the slots 84 in the pagoda roof 80.

In the embodiment shown in FIGS. 6–8, the heat exchangers operate by convection and do not require powered fans. Heat generated by the electrical equipment within the interior 92 of the cabinet 70 will be absorbed by the fins 42 and 44 of each heat exchanger section, and will be transferred by conduction to the air in the channels 28. The heated air in the channels 28 then rises, maintaining a continuous upward flow of air in the channels 28 between the vent or louvers 82 at the bottom of the cabinet and the slots 84 at the top. It will be appreciated that, although the vertical orientation of the heat exchangers 20 in FIGS. 6–8 allows them to operate efficiently by passive convection, circulating fans may be employed if desired. These fans may be installed in either or both of the plenum chambers 90 and 94, and additional fans may be installed in the interior 92 of the cabinet 70 in order to improve the air circulation through the fins 42 and 44 of the heat exchangers 20.

As noted previously, the stacking of the heat exchanger sections results in the longitudinal opening 40 of one end section remaining open, since it is not closed off by the longitudinal wall of an adjacent heat exchanger section. In the absence of any additional partition or baffle plate, this would leave an opening permitting air to flow into the interior 92 of the cabinet 70. In order to avoid this result, a partition or baffle plate 96 may be affixed to the last heat exchanger section in each stack, as illustrated in FIG. 6. Alternatively, the longitudinal opening 40 of the last heat exchanger section may be allowed to remain open, but the apertures in the plenums 90 and 94 may be shaped so that they close off the top and bottom of the channel 28 in that heat exchanger section.

An air-to-air heat exchanger 98 constructed in accordance with a second embodiment of the present invention is illustrated in FIGS. 9–11. This embodiment is similar to the first embodiment in that it can be assembled by stacking a number of substantially identical heat exchanger sections 100, 102 and 104, but it differs in that the heat exchange is carried out between two air flows in adjacent channels. Referring particularly to FIG. 9, two sets of channels 106 and 108 with rectangular cross-sections are employed, with one set typically being used for a flow of cooling air and the other set being used for a flow of air to be cooled. The channels 106 and 108 alternate across the width of the heat exchanger 98, with each channel having inlet and outlet ends at the top and bottom of the heat exchanger, or vice-versa. It should be understood that the use of the terms "inlet" and "outlet" herein is merely for convenience, and is not intended to restrict either of the channels 106 or 108 to a specific air flow direction.

The configuration of an individual heat exchanger section 100 may best be understood by reference to the exploded view of FIG. 10. Each of the channels 106 is defined by a longitudinal side wall 114 with laterally opposed edges 116 and 118, and by second and third longitudinal side walls 120 and 122 which are joined at right angles to the edges 116 and 118, respectively. The second and third side walls 120 and 122 are unconnected to each other to leave a longitudinal opening 124 extending along the vertical length of the channel 106 between its inlet and outlet ends. Each of the second channels 108 is disposed adjacent to and between the first channels 106. The second channel 108 is defined by a fourth longitudinal side wall 126 having first and second laterally opposed edges 128 and 130, with the edge 128 being joined at right angles to the rearmost edge of the side wall 122. In this way, the side wall 122 forms a common side wall between the first and second channels 106 and 108. The second channel 108 is further defined by a fifth side wall 132 which is joined at right angles to the edge 130 of the fourth side wall 126. The fifth side wall 132 is unconnected to the side wall 122, thereby leaving a longitudinal opening 134 extending along the vertical length of the second channel 108 between its inlet and outlet ends. In the illustrated embodiment, therefore, the longitudinal openings 124 and 134 face in opposite directions with respect to the plane of the heat exchanger section 100. It will also be apparent that, when the heat exchanger section 100 is formed with more than one pair of first and second channels 106 and 108, as in the illustrated embodiment, the fifth longitudinal wall 132 that defines the second channel 108 will simultaneously serve as one of the longitudinal walls of the next channel 106.

As illustrated in FIGS. 9 and 10, the heat exchanger section 100 is connected to a like heat exchanger section 102, by any of the methods described previously, in a manner such that the channels 106 and 108 of the section 100 align with the corresponding channels 106 and 108 of the next section 102. When the heat exchanger sections 100 and 102 are connected in this manner, the longitudinal opening 124 in the first channel 106 of the second heat exchanger section 102 will be closed off by the side wall 114 of the first heat exchanger section 100. The channel 106 of the heat exchanger section 102 then becomes a closed conduit for a flow of air. In a similar manner, the longitudinal opening 134 in the second channel 108 of the first heat exchanger section 100 is closed off by the side wall 126 of the second heat exchanger section 102, so that the second channel 108 of the first heat exchanger section 100 also becomes a closed conduit for a flow of air. This is repeated for the remaining first and second channels 106 and 108 of the respective heat exchanger sections 100 and 102, resulting in successive pairs of adjacent conduits corresponding to the channels 106 and 108.

In order to increase the cooling capacity of the heat exchanger 98, the heat exchanger sections 100, 102 and 104 are each formed with heat exchange fins 136 and 138 which extend outwardly from the outermost ones of the channels 106. The fins 136 and 138 are preferably rectangular and extend in the same plane as the longitudinal side walls 126 of the channels 108. The left-hand fin 136 is preferably joined to the rear edge of the longitudinal side wall 120 of the channel 106 at the leftmost edge of the heat exchanger section, and the right-hand fin 138 is attached in a similar manner to the longitudinal side wall 122 of the channel 106 at the rightmost edge of the heat exchanger section. This construction allows each heat exchanger section 100, 102 and 104 to be formed from a single sheet of material, as will be discussed shortly in connection with FIG. 12. It will be appreciated that the fins 136 and 138 are not essential to the operation of the heat exchanger 98, and may be omitted if desired.

With continued reference to FIGS. 9–11, the longitudinal side walls 114, 120 and 122 of each channel 106 extend vertically above the uppermost edges of the fins 136, 138 and longitudinal walls 126 as shown. Similarly, at the bottom of the heat exchanger 98, the longitudinal walls 114, 120 and 122 extend downwardly beyond the lowermost edges of the fins 136, 138 and longitudinal side walls 126. This makes it easier to isolate the air flows in the channels 106 from the air flows in the channels 108. One way in which this may be accomplished is to employ a partition or baffle plate 140 as illustrated in FIGS. 9 and 11. The baffle plate 140 is formed with rectangular apertures 142 which are dimensioned to fit tightly around the upwardly projecting portions of the channels 106. A similar baffle plate (not shown) may be employed at the bottom of the heat exchanger 98. The region above the top baffle plate 140 can be used to establish a plenum chamber which communicates only with the channels 106 of the heat exchanger 98 and not with the channels 108, as illustrated in FIG. 11. Similarly, the region below the baffle plate 140 communicates only with the channels 108 and not with the channels 106, and can be used to define a second plenum chamber if desired. A similar arrangement can be employed at the bottom of the heat exchanger 98. A vertical partition (not shown) similar to the partition 96 of FIG. 6 may be affixed to the rear of the innermost heat exchanger section 100 between the upper and lower baffle plates in order to close off the channels 106 of the innermost heat exchanger section. Alternatively, the apertures 142 in the upper and lower baffle plates may be formed with projecting flaps or tabs 143 for closing off the channels 106 of the innermost heat exchanger section 100.

The operation of the heat exchanger 98 will be evident from FIGS. 9–11. A flow of cooling air may be maintained through the channels 106, either by natural convection or by means of one or more powered fans. The intervening channels 108 may then be used to carry a flow air to be cooled, and this air flow may be either convective or assisted by powered fans. Heat is transferred from the air in the channels 108 to the air in the adjacent channels 106 through the common longitudinal walls 122 and 132, and this transfer will be particularly effective if the heat exchanger sections 100, 102 and 104 are made of a material characterized by a high thermal conductivity, such as aluminum. When a repeating sequence of channels 106 and 108 is employed, as in the illustrated embodiment, the effective area of heat transfer is large and the heat exchanger 98 operates very efficiently. It will be apparent that the functions of the channels 106 and 108 may be reversed if desired, with the channels 108 carrying the flow of cooling air and the channels 106 carrying the flow of air to be cooled. It will also be apparent that the air flows through the respective channels 106 and 108 need not be in the same direction; that is, the air flow in the channels 106 may be upward and the air flow in the channels 108 may be downward, or vice-versa. Finally, it will be evident that the various channels 106 may carry separate air flows originating from different sources, rather than a single air flow originating from a common plenum chamber. The channels 108 may, of course, be employed in a similar manner.

Figure 12:
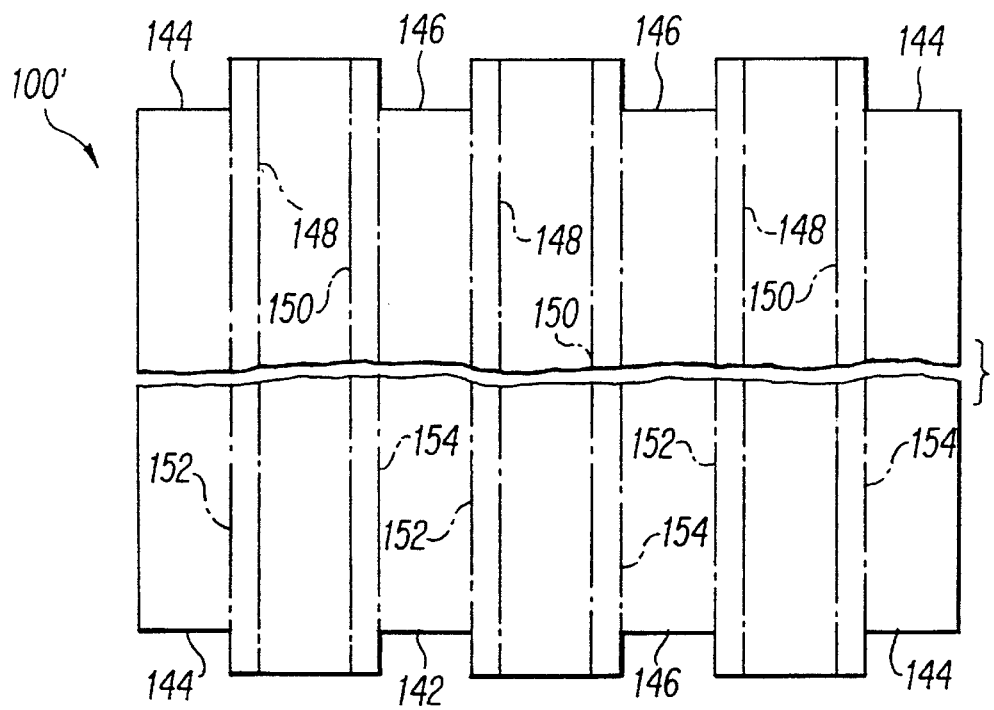
FIG. 12 is a plan view of a sheet material blank which may be used to form one of the heat exchanger sections shown in FIG. 10.

FIG. 12 illustrates a sheet material blank 100' which may be used to form one of the heat exchanger sections 100, 102 or 104 of FIGS. 9 and 10. The blank 100' is cut from a rectangular sheet of 0.010 to 0.025-inch thick aluminum with notches 144 and 146 at the corners and along the upper and lower surfaces as shown. The blank is folded along first and second sets of fold lines 148 and 150 corresponding to the laterally opposed edges 116 and 118 in order to form the longitudinal side walls 120 and 122, respectively, of the channels 106. The blank is also folded along third and fourth sets of fold lines 152 and 154 corresponding to the laterally opposed edges 128 and 130 in order to form the side walls 126 of the channels 108 and the heat exchanger fins 136 and 138.

FIGS. 13–16 illustrate the manner in which heat exchangers of the type illustrated in FIGS. 9–11 may be installed in an electrical cabinet 156. The exterior of the electrical cabinet 156, shown in FIG. 13, is similar to that shown in FIG. 5 except that double doors 158 and 160 provided at the front of the cabinet. A similar pair of doors 162 and 164 is provided at the rear of the cabinet, as illustrated in the top view of FIG. 14. The side walls 166 and 168 of the cabinet are provided with vents or louvers 170 and 172 near the base of the cabinet, and cooling air drawn in through these vents is exhausted through slots 174 at the top of the cabinet. The cabinet roof 178 is preferably of the pagoda type, as illustrated, with the slots 174 running across the width of the cabinet.

Figure 14:
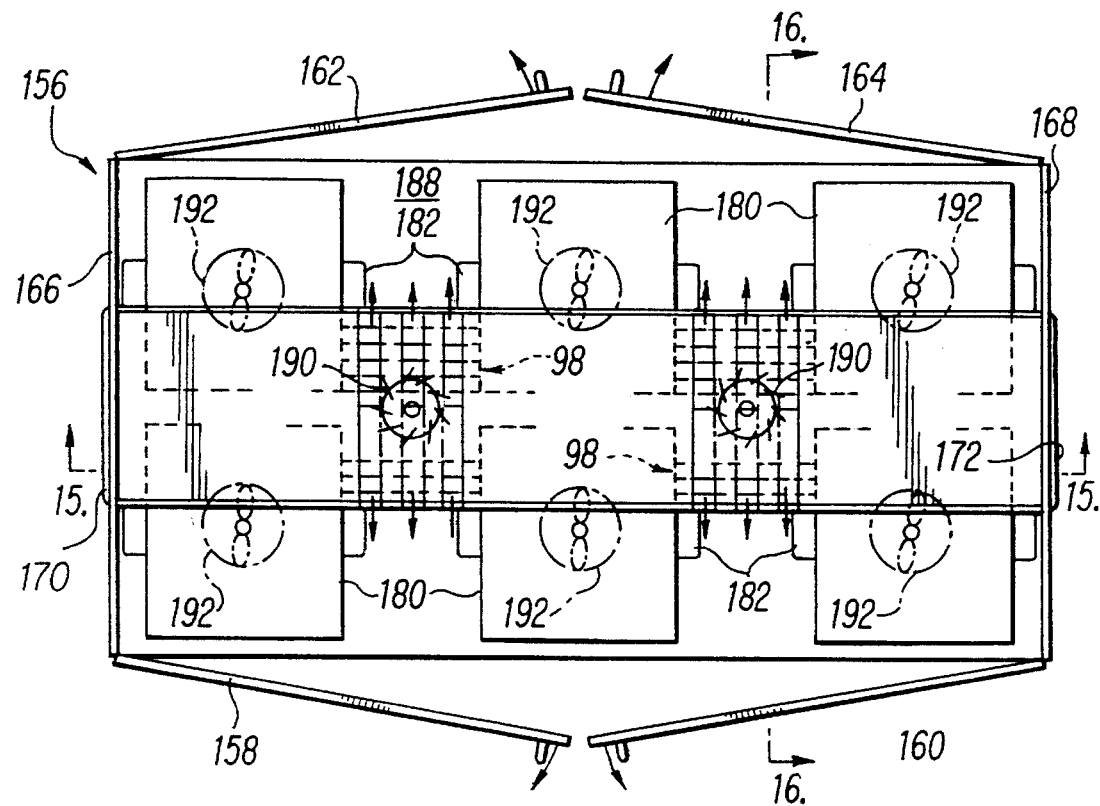
FIG. 14 is top sectional view of the electrical cabinet shown in FIG. 13.
Figure 15:
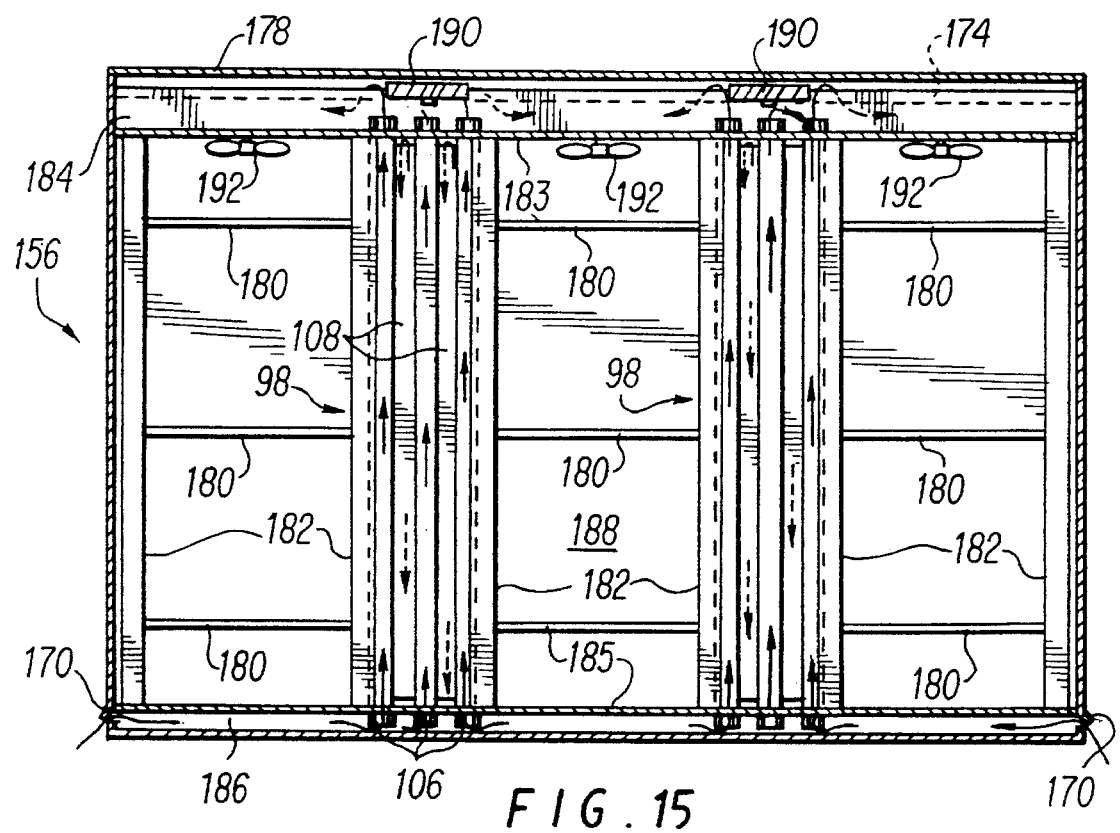
FIG. 15 is a front sectional view of the electrical cabinet shown FIG. 13.
Figure 16:
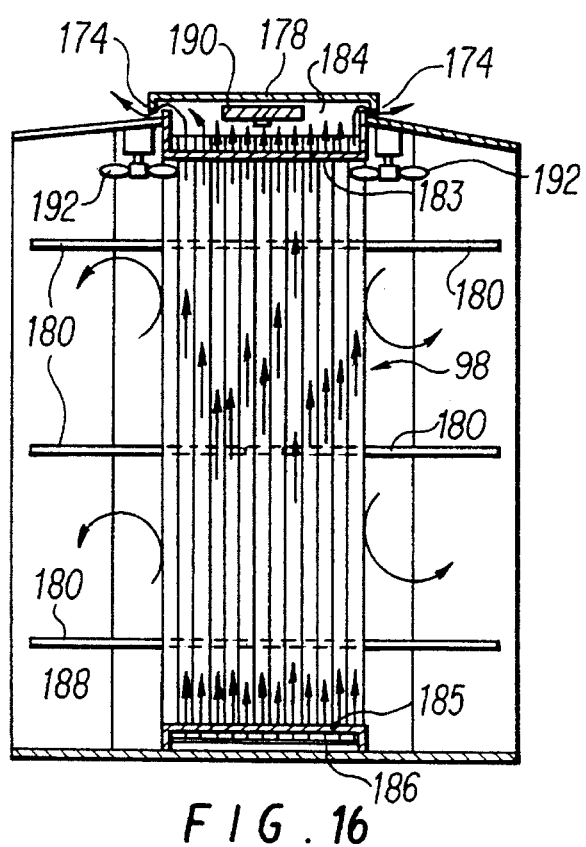
FIG. 16 is a side sectional view of the electrical equipment cabinet shown in FIG. 13.

Referring now to FIGS. 14–16, two heat exchangers 98 of the type illustrated in FIGS. 9–11 (although consisting of a greater number of individual heat exchanger sections) are installed in the central interior portion of the cabinet 156 between adjacent pairs of equipment shelves 180 and vertical channel members 182. Using partitions 183 and 185 at the top and bottom of the heat exchangers 98 which are similar to the partition 140 shown in FIGS. 9 and 11, plenum chambers 184 and 186 are formed at the top and bottom of the cabinet 156. The plenum chambers 184 and 186 communicate with the projecting channels 106 of the heat exchangers 98, with the air in the plenum chambers 184 and 186 and channels 106 being isolated from the air in the interior 188 of the cabinet 156. The air in the interior 188 of the cabinet 156 communicates with the channels 108, and enters and leaves these channels through the gaps formed between the upper and lower edges of these channels and the respective partitions 183 and 185. Although the heat exchangers 98 can be allowed to operative by passive convection, fans are preferably employed to achieve a more efficient air flow through the heat exchangers. In the illustrated embodiment, two centrifugal fans 190 are mounted in the upper plenum chamber 184 at positions directly above the outlet ends of the channels 106 in each heat exchanger 98. Operation of the fans 190 will cause air to be drawn upwardly through the channels 106 and to be expelled in a lateral direction through the slots 174 in the roof 178 of the cabinet 156. The partial vacuum thus created in the channels 106 will cause air to be drawn in at the inlet ends of the channels 106 through the lower plenum chamber 186 and vents 170, thereby maintaining a continuous flow of air in the channels 106. The resulting cooling effect will reduce the temperature of the walls of the adjoining channels 108, causing the air in these channels to flow in a downward direction by convection. Heated air from the interior 188 of the cabinet 156 will be continuously recirculated through the channels 108, thereby dissipating the heat created by the operation of the electrical components (not shown) housed in the interior of the cabinet. Preferably, circulating fans 192 are mounted in the interior 188 of the cabinet 156 at positions above the shelves 180, in order to circulate air upwardly through the racks of electronic equipment. This insures better circulation of the air within the cabinet interior 188 than would be obtained by simply relying on natural convective effects. If desired, a separate system of fans and plenum chambers may be used to force air from the interior 188 of the cabinet 156 through the channels 108, so that it is not necessary to rely entirely on passive convection to maintain this air flow.

Figure 17:
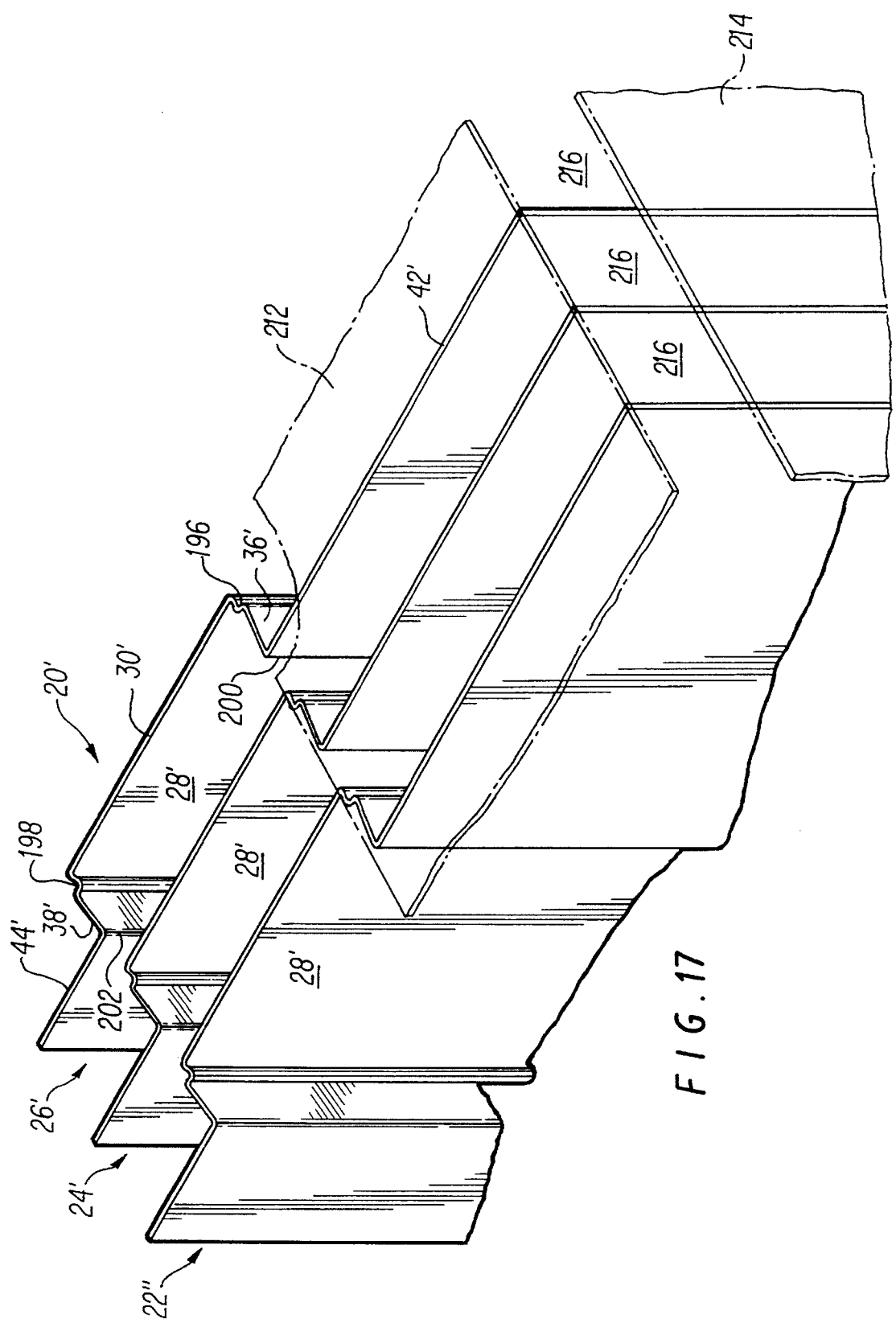
FIG. 17 is a perspective view of a third embodiment of an air-to-air heat exchanger constructed in accordance with the present invention, in which the individual heat exchanger sections or modules can be snapped together.
Figure 18:
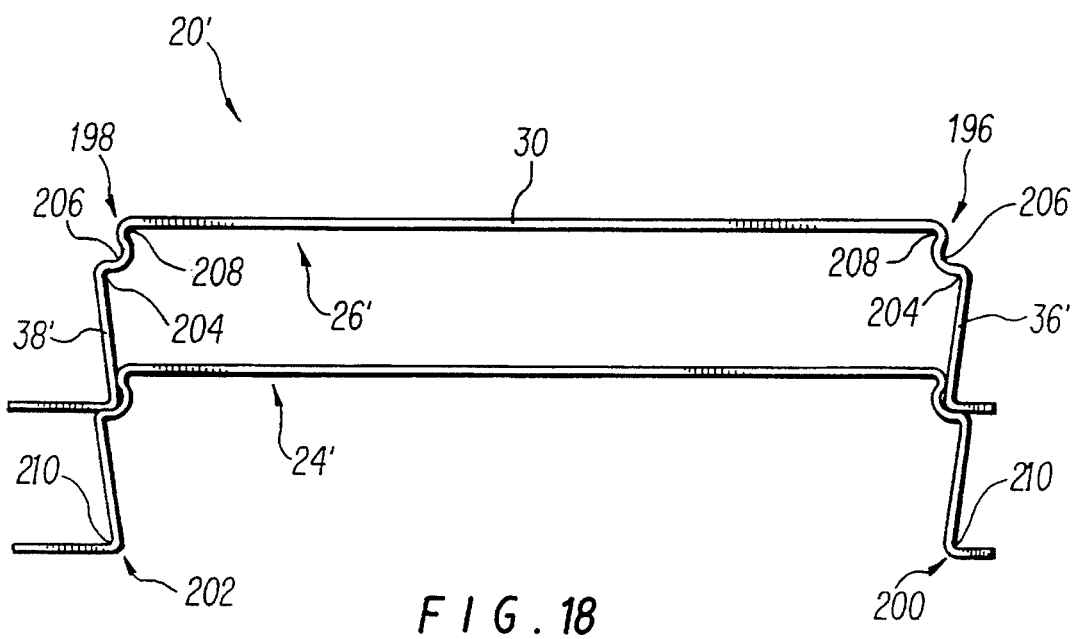
FIG. 18 is a top view of a portion of the heat exchanger of FIG. 17, illustrating the manner in which the adjacent heat exchanger sections are attached to each other.

FIGS. 17 and 18 illustrate a third embodiment 20' of an air-to-air heat exchanger which is a modification of the heat exchanger 20 shown in FIGS. 1–3. In the modified embodiment 20', longitudinal grooves or notches 196 and 198 are formed along the edges Joining the longitudinal side wall 30' with the shorter longitudinal side walls 36' and 38', as shown. In addition, the side walls 36' and 38' taper slightly inward (i.e., toward each other) in the direction away from the longitudinal side wall 30'. The longitudinal side walls 36' and 38' are joined to the fins 42' and 44', respectively, along longitudinally extending edges or corners 200 and 202. In order to assemble the heat exchanger 20', the individual sections 22', 24' and 26' are joined together by snapping the edges or corners 200 and 202 into the corresponding grooves 196 and 198. This eliminates the need for welding or brazing in order to couple the heat exchanger sections together. The heat exchanger sections 22', 24' and 26' are shown slightly separated in FIG. 17 for clarity, but two of the sections 24' and 26' are shown Joined to each other in FIG. 18. As illustrated in FIG. 18, each of the grooves 196 and 198 is formed by a series of radiused areas 204, 206 and 208. In the preferred embodiment, the respective radii of these areas is 0.010 inch for the radiused areas 204 and 208, and 0.015 inch for the radiused area 206. The corners 200 and 202 are preferably formed by radiused areas 210 having radii of 0.010 inch. The heat exchanger sections 22', 24' and 26' are preferably made from 0.010-inch thick aluminum alloy, but may be made from other materials or have different thicknesses if desired. The amount of inward taper of the longitudinal side walls 36' and 38' will depend to some extent on the material chosen and its thickness, with the object being to provide sufficient resiliency to maintain the corners 200 and 202 in firm engagement with the grooves 196 and 198, respectively, when the heat exchanger sections are Joined together. In the preferred embodiment utilizing 0.010-inch thick aluminum alloy for the heat exchanger sections, the taper angle of the longitudinal side walls 36' and 38' is approximately 8.4° when the sections are not connected to each other and approximately 7° when the sections are connected.

The heat exchanger 20' of FIGS. 17 and 18 may be used in the same manner as the heat exchanger of FIGS. 1–3, that is, by maintaining an air flow in the channels 28' to release or absorb heat from the air surrounding the fins 42' and 44'. If desired, the longitudinal side walls 30', 36' and 38' of each heat exchanger section may be extended above and below the top and bottom edges of the fins 42' and 44', as in the embodiment of FIGS. 1–3, in order to create a projecting duct or fitting leading to the channels 28'. As a further modification, baffle plates or partitions 212 and 214 (shown in phantom in FIG. 17) can be placed across the top and side edges of the fins 42' and held in place by welding, brazing or any other suitable method. The assembled heat exchanger 20' then defines two mutually isolated air flow paths, one comprising the channels 28' and the other comprising the vertical gaps 216 between the fins 42'. Baffle plates partitions may be affixed in a similar manner to the fins 44' to provide a third air flow path, and this air flow path may be combined with the air flow path through the channels 28' if desired. In FIG. 17, the length of the fins 42' is shown as being greater than the length of the fins 44' in order to create gaps 216 which are roughly similar in size to the channels 28'. However, it will be understood that the fins 42' and 44' may be of equal size, as in the embodiment of FIGS. 1–3.

Figure 20:
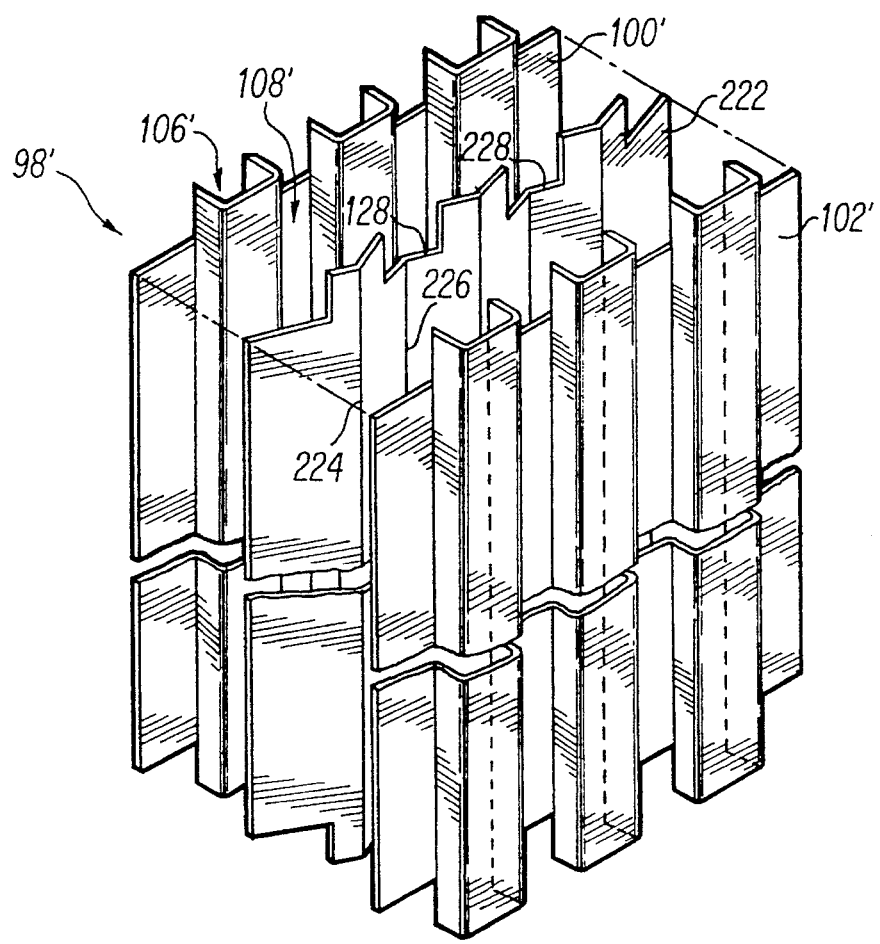
FIG. 20 is an exploded perspective view of a fifth embodiment of an air-to-air heat exchanger constructed in accordance with the present invention, also employing a sealing plate.

FIG. 19 illustrates a fourth embodiment 20" of an air-to-air heat exchanger which represents a further modification of the previous embodiments of FIGS. 1–3 and 17–18. In this embodiment, the heat exchanger sections are formed without the longitudinal grooves 196 and 198 of FIG. 17, and hence may be coupled together using any of the methods described previously in connection with FIGS. 1–3. However, rather than being fastened directly to each other, the heat exchanger sections 22", 24" and 26" of FIG. 19 are coupled to each other by means of angled sealing plates 218. The sealing plates 218 are preferably made from sheets of aluminum having approximately the same dimensions as the heat exchanger sections 22", 24" and 26", and are folded along a vertical line 220 so as to form a shallow "V" when viewed from above or below. The sealing plates 218 are interposed between adjacent pairs of heat exchanger sections 22", 24" and 26" with the point or apex of the "V" facing the interior surface of the longitudinal side wall 30" of each channel 28", as shown. The principal advantage of the sealing plates 218 is that they provide a flat sealing surface between the confronting or opposing corners 32", 34" and 46", 48", respectively, of adjacent heat exchanger sections. This provides a more airtight seal between the heat exchanger sections and avoids the tendency of the corners 46", 48" to be spread apart by the opposing corners 32", 34" of the adjacent heat exchanger section when the two sections are pressed into contact with one another. A second advantage of the sealing plates 218 is that they extend between adjacent pairs of the fins 42" and 44" to provide additional fin surfaces, thereby enhancing the exchange of heat to or from the air flowing in the channels FIG. 20 illustrates a fifth embodiment 98' of an air-to-air heat exchanger in accordance with the present invention.

This embodiment is similar in most respects to the heat exchanger 98 of FIGS. 9–11, although a sealing plate 222 having the same function as the sealing plates 218 of FIG. 19 has been interposed between the adjacent heat exchanger sections 100' and 102'. In this case, the sealing plate 222 has a corrugated or zig-zag configuration defined by a number of vertical fold lines 224 and 226 which form alternating peaks facing in opposite directions along the length of the sealing plate. The sealing plate 222 is interposed between the sections 100' and 102' of the heat exchanger 98' in a manner such that the fold lines 224 are received in the channels 106' and the alternating fold lines 226 are received in the channels 108'. Preferably, the top and bottom edges of the sealing plate 222 are provided with notches or cut-outs 228 at the upper and lower extremities of the fold lines 226, in order to facilitate air entry into the top and bottom of the channels 108.

While number of exemplary embodiments have been chosen to illustrate the present invention, it will be understood by those skilled in the art that various changes and modifications can be made therein without departing from the spirit and scope of the invention as defined in the appended claims. For example, it will be apparent that the disclosed heat exchangers may be used for heating rather than cooling, since the principles involved are essentially the same. Also, although the heat exchangers have been characterized as air-to-air heat exchangers, it will be apparent that gases or fluids other than air may be employed if desired. Finally, it should be understood that the heat exchangers may be installed in any desired manner in an electrical cabinet or other enclosure, with the particular installations shown being merely exemplary. For example, the heat exchangers can be mounted on the interior door surface of an electrical cabinet rather than at a location within the interior of the cabinet, since the cabinet area immediately inside the door is ordinarily not occupied by electronic equipment.

What is claimed is:

1. A heat exchanger section adapted to be connected to one or more like sections to form an air-to-air heat exchanger for cooling an electrical equipment cabinet, said section comprising:

a channel defined by a first longitudinal side wall having first and second laterally opposed edges, and by second and third longitudinal side walls joined to said first and second laterally opposed edges, respectively, said second and third side walls being unconnected to each other to leave a longitudinal opening extending along the length of said channel; and a first heat exchange fin carried by at least one of said second and third side walls and extending outwardly with respect to said channel;

said heat exchanger section being connectable to a like heat exchanger section in a manner such that the longitudinal openings in the channels of both heat exchanger sections face in the same direction, with the first side wall of one of said heat exchanger sections connecting the second and third side walls of the other heat exchanger section and thereby closing the longitudinal opening in the channel of said other heat exchanger section in order to define a conduit for a flow of air; and further wherein:

said heat exchanger section further. Comprises a second heat exchange fin carried by the other of said second and third Side walls and extending outwardly with respect to said channel;

each of said second and third side walls has first and second laterally opposed edges, the first edge of said second side wall being joined to the first edge of said first side wall and the first edge of said third side wall being joined to the second edge of said first side wall;

said first heat exchange fin is joined to the second edge of said second side wall;

said second heat exchange fin is joined to the second edge of said third side wall;

a first longitudinal groove is formed along said first edge of said first side wall for receiving the second edge of the second side wall of a connected heat exchanger section; and a second longitudinal groove is formed along said second edge of said first side wall for receiving the second edge of the third side wall of a connected heat exchanger section.

2. A heat exchanger section as claimed in claim 1, wherein said second and third side walls taper inwardly toward each other in the direction away from said first side wall.

3. A heat exchanger section as claimed in claim 1, wherein each of said first and second heat exchange fins extends in a plane which is substantially parallel to said first side wall, and wherein each of said first and second heat exchange fins terminates in a free edge.

4. A heat exchanger section as claimed in claim 1, wherein said channel and said heat exchange fins are formed from a single sheet of material, said single sheet of material being folded along first and second fold lines at said first and second laterally opposed edges to form said second and third side walls, and being folded along third and fourth fold lines to form said first and second heat exchange fins.

5. An air-to-air heat exchanger for cooling an electrical equipment cabinet, said heat exchanger comprising a plurality of connected sections which are substantially identical to each other, each of said sections comprising:

a channel for carrying a flow of air, said channel having a first longitudinal side wall and a longitudinal opening extending along the length of said channel; and at least a first heat exchange fin extending outwardly from said channel for exchanging heat between the air in said channel and the air outside said channel;

said heat exchanger sections being connected to each other in a manner such that the channels of adjacent sections extend parallel to each other and the longitudinal openings in the channels of adjacent sections face in the same direction, with the longitudinal opening in the channel of one section being closed by the first longitudinal side wall of an adjacent section and the heat exchange fins of adjacent sections being spaced apart from each other;

and further wherein:

said first side wall of the channel each section has first and second opposed edges, and said channel further comprises second and third side walls joined to said first and Second opposed edges, respectively;

each of said second and third side walls has first and second opposed edge, the first edge of said second side wall being joined to the first edge of said first side wall and the first edge of said third side wall being joined to the second edge of said first side wall; and said first heat exchange fin is joined to the second edge of said second side wall;

and wherein each of said heat exchanger sections further comprises:

a second heat exchange fin extending outwardly from said channel and joined to the second edge of said third side wall;

a first longitudinal groove formed along said first edge of said first side wall for receiving the second edge of the second side wall of a connected heat exchanger section; and a second longitudinal groove formed along said second edge of said first side wall for receiving the second edge of the third side wall of a connected heat exchanger section.

6. An air-to-air heat exchanger as claimed in claim 5, wherein said second and third side walls of each heat exchanger section taper inwardly toward each other in the direction away from said first side wall.

7. An air-to-air heat exchanger as claimed in claim 5, wherein said first and second heat exchange fins extend in planes which are substantially parallel to said first side wall, and wherein said first and second heat exchange fins terminate in free edges.

8. An air-to-air heat exchanger as claimed in claim 5, wherein each of said heat exchanger sections is formed from a single sheet of material, said single sheet of material being folded along first and second fold lines at said first and second opposed edges to form said second and third side walls, and being folded along third and fourth fold lines to form said first and second heat exchange fins.

9. A heat exchanger section adapted to be connected to one or more like sections to form an air-to-air heat exchanger for cooling an electrical equipment cabinet, said section comprising:

a first channel having inlet and outlet ends and defined by a first longitudinal side wall having first and second laterally opposed edges, and by second and third longitudinal side walls joined to said first and second laterally opposed edges, respectively, said second and third side walls being unconnected to each other to leave a longitudinal opening extending along the length of said first channel between said inlet and outlet ends of said first channel; and a second channel adjacent to said first channel and having inlet and outlet ends, said second channel defined by a fourth longitudinal side wall having first and second laterally opposed edges, one of said first and second laterally opposed edges of said fourth side wall being joined to one of said second and third side walls of said first channel so that said second or third side wall of said first channel forms a common side wall with said second channel, said second channel being further defined by a fifth side wall joined to the other of said first and second laterally opposed edges of said fourth side wall, said fifth side wall being unconnected to said second or third side wall of said first channel to leave a longitudinal opening extending along the length of said second channel between the inlet and outlet ends of said second channel;

wherein said heat exchanger section is connectable to a like heat exchanger section in a manner such that said longitudinal opening in said first channel is closed off by the first side wall of a connected heat exchanger section in order to define a first conduit for a flow of air, and said fourth side wall closes off the longitudinal opening in the second channel of a connected heat exchanger section in order to define a second conduit for a flow of air, and further wherein said first, second and third side walls of said first channel extend beyond said fourth side wall of said second channel at the inlet and outlet ends of said first and second channels.

10. A heat exchanger section as claimed in claim 9, wherein:

each of said second, third and fifth side walls extends substantially perpendicular to each of said first and fourth side walls to provide each of said first and second channels with a substantially rectangular cross-section; and each of said second, third and fifth side walls has first and second laterally opposed edges, with the first edge of said second side wall being joined to the first edge of said first side wall, the first edge of said third side wall being Joined to the second edge of said first side wall, the second edge of said third side wall being joined to the first edge of said fourth said wall, and the first edge of the fifth side wall being joined to the second edge of the fourth side wall.

11. A heat exchanger section as claimed in claim 10, wherein said first and second channels are formed from a single sheet of material, said single sheet of material being folded along first and second fold lines at said first and second laterally opposed edges of said first side wall to form said second and third side walls, and being folded along third and fourth fold lines at said first and second laterally opposed edges of said fourth side wall to form said fourth and fifth side walls.

12. A heat exchanger section as claimed in claim 9, further comprising a heat exchange fin carried by and extending outwardly from at least one of said first and second channels, said heat exchange fin serving to exchange heat between the air in said channel and the air outside said channel.

13. An air-to-air heat exchanger for cooling an electrical equipment cabinet, said heat exchanger comprising a plurality of connected sections which are substantially identical to each other, each of said sections having opposing first and second faces, said first face having a pair of edges which are spaced apart from each other, and said second face having a pair of grooves for receiving the edges on the first face of a connected heat exchanger section.

14. A heat exchanger section adapted to be connected to one or more like sections to form an air-to-air heat exchanger for cooling an electrical equipment cabinet or the like, said section comprising:

a channel defined by a first longitudinal side wall having first and second laterally opposed edges, and by second and third longitudinal side walls joined to said first and second laterally opposed edges, respectively, said second and third side walls being unconnected to each other to leave a longitudinal opening extending along the length of said channel; and a first heat exchange fin carried by at least one of said second and third side walls and extending outwardly with respect to said channel;

said heat exchanger section being connectable to a like heat exchanger section in a manner such that the first side wall of the connected heat exchanger section closes the longitudinal opening in said channel in order to define a conduit for a flow of air, said first heat exchange fin serving to exchange heat between the air in said conduit and the air outside said conduit; and further wherein:

said heat exchanger section further comprises a second heat exchange fin carried by the other of said second and third side walls and extending outwardly with respect to said channel;

each of said second and third side walls has first and second laterally opposed edges, the first edge of said second side wall being joined to the first edge of said first side wall and the first edge of said third side wall being joined to the second edge of said first side wall;

said first heat exchange fin is joined to the second edge of said second side wall;

said second heat exchange fin is joined to the second edge of said third side wall;

a first longitudinal groove is formed along said first edge of said first side wall for receiving the second edge of the second side wall of a connected heat exchanger section; and a second longitudinal groove is formed along said second edge of said first side wall for receiving the second edge of the third side wall of a connected heat exchanger section.

15. A heat exchanger section as claimed in claim 14, wherein said second and third side walls taper inwardly toward each other in the direction away from said first side wall.

16. An air-to-air heat exchanger for cooling an electrical equipment cabinet, said heat exchanger comprising a plurality of connected sections which are substantially identical to each other, each of said sections comprising:

a channel for carrying a flow of air; and at least a first heat exchange fin extending outwardly from said channel for exchanging heat between the air in said channel and the air outside said channel;

said heat exchanger sections being connected to each other in a manner such that the channels of adjacent sections extend parallel to each other and the heat exchange fins of adjacent sections are spaced apart from each other; and further wherein:

said channel of each section comprises a first side wall having first and second opposed edges, and second and third side walls joined to said first and second opposed edges, respectively;

each of said second and third side walls has first and second opposed edges, the first edge of said second side wall being joined to the first edge of said first side wall and the first edge of said third side wall being joined to the second edge of said first side wall; and said first heat exchange fin is Joined to the second edge of said second side wall; and wherein each of said heat exchanger sections further comprises:

a second heat exchange fin extending outwardly from said channel and joined to the second edge of said third side wall;

a first longitudinal groove formed along said first edge of said first side wall for receiving the second edge of the second side wall of a connected heat exchanger section; and a second longitudinal groove formed along said second edge of said first side wall for receiving the second edge of the third side wall of a connected heat exchanger section.

17. An air-to-air heat exchanger as claimed in claim 16, wherein said second and third side walls of each heat exchanger section taper inwardly toward each other in the direction away from said first side wall.

18. An air-to-air heat exchanger for cooling an electrical equipment cabinet, said heat exchanger comprising a plurality of connected sections which are substantially identical to each other, each of said sections comprising:

a first channel having an inlet end, an outlet end, longitudinal walls extending between said inlet and outlet ends, and a longitudinal opening extending along the length of said first channel between said inlet and outlet ends of said first channel; and a second channel adjacent to said first channel, said second channel having an inlet end, an outlet end, longitudinal walls extending between said inlet and outlet ends, and a longitudinal opening extending along the length of said second channel between said inlet and outlet ends of said second channel;

wherein said heat exchanger sections are connected to each other in a manner such that said longitudinal openings in said first and second channels of each heat exchanger section are closed off by opposing longitudinal walls of at least one connected heat exchanger section in order to define first and second air flow conduits; and wherein said longitudinal openings in said first and second channels of each heat exchanger section face in opposite directions, and said longitudinal openings in said first and second channels of each heat exchanger section are closed off by opposing longitudinal walls of two connected heat exchanger sections disposed on opposite sides of said heat exchanger section.

19. An air-to-air heat exchanger for cooling an electrical equipment cabinet, said heat exchanger comprising a plurality of connected sections which are substantially identical to each other, each of said sections comprising:

a first channel having an inlet end, an outlet end, longitudinal walls extending between said inlet and outlet ends, and a longitudinal opening extending along the length of said first channel between said inlet and outlet ends of said first channel; and a second channel adjacent to said first channel, said second channel having an inlet end, an outlet end, longitudinal walls extending between said inlet and outlet ends, and a longitudinal opening extending along the length of said second channel between said inlet and outlet ends of said second channel;

wherein said heat exchanger sections are connected to each other in a manner such that said longitudinal openings in said first and second channels of each heat exchanger section are closed off by opposing longitudinal walls of at least one connected heat exchanger section in order to define first and second air flow conduits; and wherein said first and second channels of each heat exchanger section share a common longitudinal wall.

20. An air-to-air heat exchanger for cooling an electrical equipment cabinet, said heat exchanger comprising a plurality of connected sections which are substantially identical to each other, each of said sections comprising:

a first channel having an inlet end, an outlet end, longitudinal walls extending between said inlet and outlet ends, and a longitudinal opening extending along the length of said first channel between said inlet and outlet ends of said first channel; and a second channel adjacent to said first channel, said second channel having an inlet end, an outlet end, longitudinal walls extending between said inlet and outlet ends, and a longitudinal opening extending along the length of said second channel between said inlet and outlet ends of said second channel;

wherein said heat exchanger sections are connected to each other in a manner such that said longitudinal openings in said first and second channels of each heat exchanger section are closed off by opposing longitudinal walls of at least one connected heat exchanger section in order to define first and second air flow conduits; and wherein the inlet and outlet ends of said first channel extend lengthwise beyond the inlet and outlet ends of said second channel;

and further comprising first and second transverse partitions at the inlet and outlet ends of the respective channels for isolating the air flow in said first channel from the air flow in said second channel.

21. An air-to-air heat exchanger as claimed in claim 45, wherein each of said heat exchanger sections comprises a plurality of said first channels and a plurality of said second channels, and wherein said transverse partitions define plenum chambers for combining the air flow in said plurality of first channels and for combining the air flow in said plurality of second channels.

\* \* \* \* \*